United States Patent
Shearman et al.

(10) Patent No.: US 12,419,010 B2
(45) Date of Patent: Sep. 16, 2025

(54) DUAL FLOW LOW PROFILE COOLANT DISTRIBUTION MANIFOLD

(71) Applicant: Ciena Corporation, Hanover, MD (US)

(72) Inventors: Simon J. Shearman, Carleton Place (CA); Behzad Mohajer, Vancouver (CA); Peter Ajersch, Ottawa (CA)

(73) Assignee: Ciena Corporation, Hanover, MD (US)

( * ) Notice: Subject to any disclaimer, the term of this patent is extended or adjusted under 35 U.S.C. 154(b) by 195 days.

(21) Appl. No.: 18/381,265

(22) Filed: Oct. 18, 2023

(65) Prior Publication Data

US 2025/0133691 A1 Apr. 24, 2025

(51) Int. Cl.
*H05K 7/20* (2006.01)
*H01R 12/72* (2011.01)

(52) U.S. Cl.
CPC ....... *H05K 7/20254* (2013.01); *H01R 12/725* (2013.01); *H05K 7/20281* (2013.01); *H01R 2201/04* (2013.01)

(58) Field of Classification Search
CPC .......... H05K 7/20254; H05K 7/20281; H01R 12/725; H01R 2201/04
USPC ........................................................ 361/688
See application file for complete search history.

(56) References Cited

U.S. PATENT DOCUMENTS

| | | | | |
|---|---|---|---|---|
| 6,807,056 B2* | 10/2004 | Kondo | ............... | H05K 7/20781 361/689 |
| 7,187,549 B2* | 3/2007 | Teneketges | ........... | H01L 23/473 361/689 |
| 7,336,487 B1* | 2/2008 | Chrysler | ............... | H01L 23/473 361/679.48 |
| 7,639,499 B1* | 12/2009 | Campbell | .......... | H05K 7/20772 165/104.19 |
| 7,710,723 B2* | 5/2010 | Korich | ............... | H05K 7/20927 174/15.1 |
| 8,279,601 B2* | 10/2012 | Lima | ......................... | G06F 1/20 361/695 |
| 8,654,532 B2* | 2/2014 | Chen | .................. | H05K 7/20781 361/689 |
| 9,634,959 B2* | 4/2017 | Coteus | ............... | H05K 7/20309 |
| 10,749,288 B2* | 8/2020 | Weltsch | .................. | B23P 19/04 |

(Continued)

OTHER PUBLICATIONS

Jan. 13, 2025 International Search Report issued in corresponding PCT Application No. PCT/US2024/051220.

(Continued)

*Primary Examiner* — Anatoly Vortman
(74) *Attorney, Agent, or Firm* — Clements Bernard Walker; Christopher L. Bernard

(57) ABSTRACT

A coolant distribution manifold assembly for use in a module or circuit pack of an optical networking system, including: a body defining a main inlet port at one end, a main outlet port at another end, and a plurality of cooling plate inlet ports and cooling plate outlet ports disposed between the main inlet port and the main outlet port; where the body further defines an upper internal plenum and a lower internal plenum each coupled to one of the main inlet port and the plurality of cooling plate inlet ports and the main outlet port and the plurality of cooling plate outlet ports. Optionally, the upper internal plenum and the lower internal plenum each have a variable cross-sectional area along a length of the body between the main inlet port and the main outlet port.

16 Claims, 29 Drawing Sheets

(56) References Cited

U.S. PATENT DOCUMENTS

| | | | |
|---|---|---|---|
| 11,659,696 B2* | 5/2023 | McEathron | H05K 7/20881 |
| | | | 361/679.47 |
| 11,980,009 B2* | 5/2024 | Mohajer | H05K 7/20272 |
| 12,262,463 B2* | 3/2025 | Bubon | G01T 1/2985 |
| 2006/0002086 A1* | 1/2006 | Teneketges | H01L 23/473 |
| | | | 257/E23.098 |
| 2006/0096738 A1* | 5/2006 | Kang | F28F 3/022 |
| | | | 257/E23.098 |
| 2007/0062673 A1* | 3/2007 | Olesen | F28F 9/0268 |
| | | | 257/E23.098 |
| 2007/0091570 A1* | 4/2007 | Campbell | H05K 7/2079 |
| | | | 361/699 |
| 2009/0284921 A1* | 11/2009 | Colgan | H01L 23/473 |
| | | | 361/699 |
| 2011/0182027 A1* | 7/2011 | Lima | G06F 1/20 |
| | | | 361/679.46 |
| 2013/0105116 A1 | 5/2013 | Campbell et al. | |
| 2013/0333778 A1* | 12/2013 | Ferrarese | F02C 7/228 |
| | | | 137/561 A |
| 2020/0006884 A1* | 1/2020 | Weltsch | H01R 13/514 |
| 2020/0229321 A1 | 7/2020 | Dogruoz et al. | |
| 2021/0112683 A1 | 4/2021 | Mohajer et al. | |
| 2022/0142013 A1 | 5/2022 | Zhou et al. | |
| 2023/0039781 A1 | 2/2023 | Mohajer et al. | |

OTHER PUBLICATIONS

Exam Report issued in corresponding EP Application No. 24799726. 5, Jun. 17, 2025.

* cited by examiner

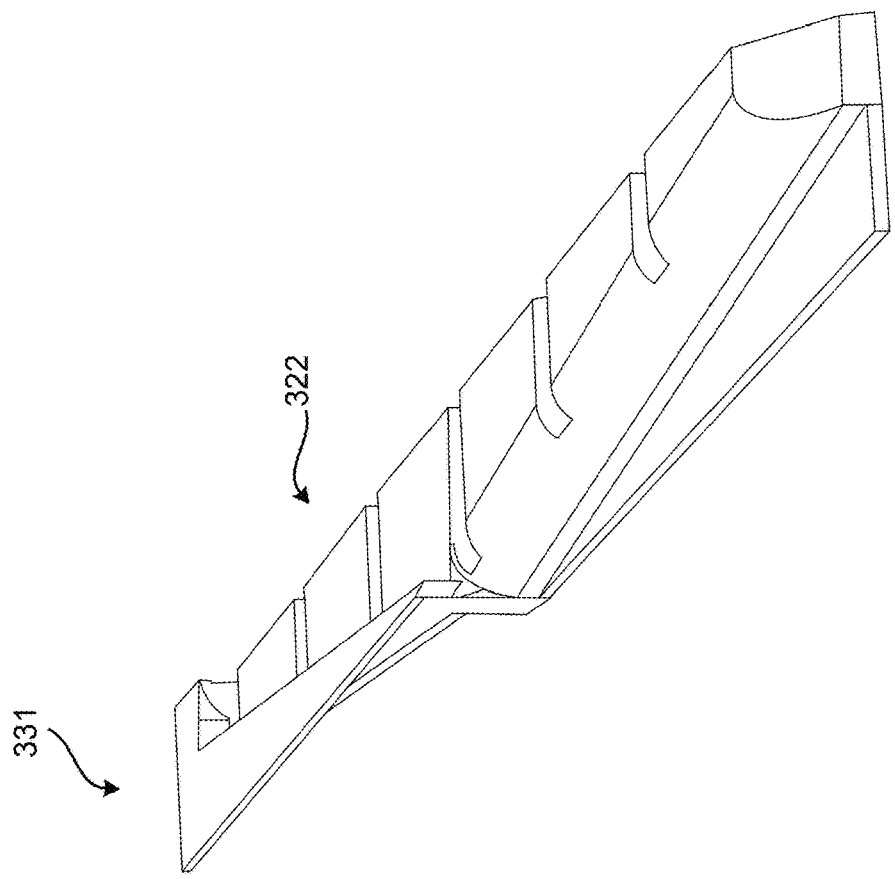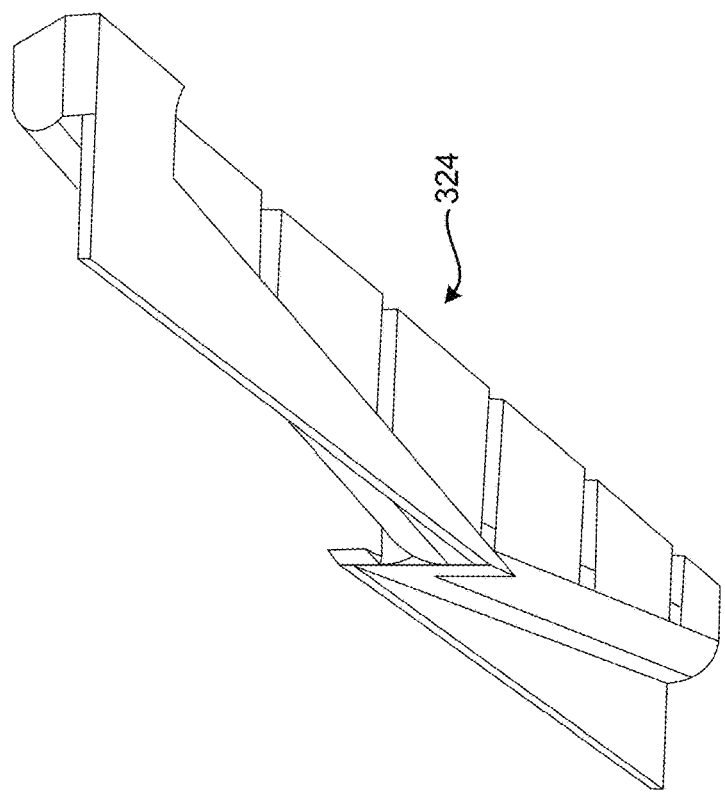
FIG. 16

DUAL FLOW LOW PROFILE COOLANT DISTRIBUTION MANIFOLD

TECHNICAL FIELD

The present disclosure relates generally to the telecommunications and networking fields. More particularly, the present disclosure relates to a dual flow low profile coolant distribution manifold for distributing parallel coolant fluid flows to faceplate optical devices, such as pluggable optical devices, of a module or circuit pack in limited height applications.

BACKGROUND

Thermal analysis has determined that it is much more efficient to distribute coolant fluid to faceplate optical devices of a module or circuit pack in a parallel flow arrangement, rather than serial flow arrangement. With Quad Small Form Factor Pluggable-Double Density (QSFP-DD) devices and the like, which are continuously getting hotter, air and fin cooling is often insufficient. Liquid or hybrid liquid/air cooling is typically more effective and allows higher power to be used.

Typically, an inlet manifold and an outlet manifold are used to distribute inlet and return coolant flows to these devices. Using two separate manifolds works if there is enough board space and height. Often, however, significant height constraints are present, especially when cooling optics on a secondary side of a printed circuit board (PCB).

The present background is provided as illustrative environmental context only and should not be construed to be limiting in any manner. It will be readily apparent to those of ordinary skill in the art that the principles and concepts of the present disclosure may be implemented in other environmental contexts equally.

BRIEF SUMMARY

The present disclosure provides a dual flow low profile coolant distribution manifold assembly and method combining two plenums into one device to save PCB height and evenly distribute parallel coolant flow paths. This is done by machining or die casting a block in the desired shape, for example. Two holes are machined or die cast for each faceplate port. One hole feeds the port with cooler fluid and the other port allows the return of the heated fluid after it cools the associated device. A first hole and tube provides fluid inlet on one end of the device, while a second hole and tube on the opposite end of the device provides heated return fluid exit to the associated coolant distribution unit. The multiple port holes are connected to provide two separate paths-one path for cool inlet fluid and another path for heated return fluid.

In one embodiment, the present disclosure provides a coolant distribution manifold assembly for use in a module or circuit pack of an optical networking system, the coolant distribution manifold assembly including: a body defining a main inlet port at one end of the body, a main outlet port at another end of the body, a plurality of cooling plate inlet ports disposed between the main inlet port and the main outlet port, and a plurality of cooling plate outlet ports disposed between the main inlet port and the main outlet port; where the body further defines an upper internal plenum coupled to one of the main inlet port and the plurality of cooling plate inlet ports and the main outlet port and the plurality of cooling plate outlet ports; and where the body further defines lower internal plenum coupled to another of the main inlet port and the plurality of cooling plate inlet ports and the main outlet port and the plurality of cooling plate outlet ports. Optionally, the body includes multiple components assembled to form a unitary body. Alternatively, the body is integrally formed. Optionally, the upper internal plenum and the lower internal plenum each have a variable cross-sectional area along a length of the body between the main inlet port and the main outlet port. The upper internal plenum and the lower internal plenum may each have a tapering cross-sectional area along a length of the body between the main inlet port and the main outlet port. Optionally, the body further defines or contains one or more internal lead-in features, lead-out features, flow encourager structures, flow discourager structures, or flow dividers, i.e., flow modification structures, associated one or more of the plurality of cooling plate inlet ports or cooling plate outlet ports.

In another embodiment, the present disclosure provides a liquid cooling assembly for an optical networking system, the liquid cooling assembly including: a coolant distribution unit; a plurality of input coolant lines coupled to a plurality of cooling plates; a plurality of output coolant lines coupled to the plurality of cooling plates; and a coolant distribution manifold assembly. The coolant distribution manifold assembly includes a body defining a main inlet port coupled to the coolant distribution unit at one end of the body, a main outlet port coupled to the coolant distribution unit at another end of the body, a plurality of cooling plate inlet ports disposed between the main inlet port and the main outlet port and coupled to the plurality of input coolant lines, and a plurality of cooling plate outlet ports disposed between the main inlet port and the main outlet port and port and coupled to the plurality of output coolant lines; where the body further defines an upper internal plenum coupled to one of the main inlet port and the plurality of cooling plate inlet ports and the main outlet port and the plurality of cooling plate outlet ports; and where the body further defines lower internal plenum coupled to another of the main inlet port and the plurality of cooling plate inlet ports and the main outlet port and the plurality of cooling plate outlet ports. Optionally, the body includes multiple components assembled to form a unitary body. Alternatively, the body is integrally formed. Optionally, the upper internal plenum and the lower internal plenum each have a variable cross-sectional area along a length of the body between the main inlet port and the main outlet port. The upper internal plenum and the lower internal plenum may each have a tapering cross-sectional area along a length of the body between the main inlet port and the main outlet port. Optionally, the body further defines or contains one or more internal lead-in features, lead-out features, flow encourager structures, flow discourager structures, or flow dividers, i.e., flow modification structures, associated one or more of the plurality of cooling plate inlet ports or cooling plate outlet ports. The coolant distribution manifold assembly is coupled to a printed circuit board disposed within a module or circuit pack of the optical networking system.

In a further embodiment, the present disclosure provides a method for providing a coolant distribution manifold assembly for use in a module or circuit pack of an optical networking system, the method including: forming a body defining a main inlet port at one end of the body, a main outlet port at another end of the body, a plurality of cooling plate inlet ports disposed between the main inlet port and the main outlet port, and a plurality of cooling plate outlet ports disposed between the main inlet port and the main outlet port; where the body further defines an upper internal plenum coupled to one of the main inlet port and the plurality of cooling plate inlet ports and the main outlet port and the plurality of cooling plate outlet ports; and where the body further defines lower internal plenum coupled to another of the main inlet port and the plurality of cooling plate inlet ports and the main outlet port and the plurality of cooling plate outlet ports. Optionally, forming the body includes assembling multiple components to form a unitary body. Alternatively, forming the body includes integrally forming the body. Optionally, the upper internal plenum and the lower internal plenum each have a variable cross-sectional area along a length of the body between the main inlet port and the main outlet port. The upper internal plenum and the lower internal plenum may each have a tapering cross-sectional area along a length of the body between the main inlet port and the main outlet port. Optionally, the body further defines or contains one or more internal lead-in features, lead-out features, flow encourager structures, flow discourager structures, or flow dividers, i.e., flow modification structures, associated one or more of the plurality of cooling plate inlet ports or cooling plate outlet ports. The method may further include one of: milling the upper internal plenum into a top surface of the body, milling the lower internal plenum into a bottom surface of the body, affixing a cover to the top surface of the body, and affixing a cover to the bottom surface of the body; and milling the upper internal plenum and the lower internal plenum into a side surface of the body and affixing one or more covers to the side surface of the body.

It will be readily apparent to those of ordinary skill in the art that aspects and features of each of the described embodiments may be incorporated, omitted, and/or combined as desired in a given application, without limitation.

BRIEF DESCRIPTION OF THE DRAWINGS

The present disclosure is illustrated and described with reference to the various drawings, in which like reference numbers are used to denote like assembly components/method steps, as appropriate, and in which:

FIG. 16 further illustrates a further embodiment of the coolant distribution manifold assembly of the present disclosure;

It will be readily apparent to those of ordinary skill in the art that aspects and features of each of the illustrated embodiments may be incorporated, omitted, and/or combined as desired in a given application, without limitation.

DETAILED DESCRIPTION

Figure 1:
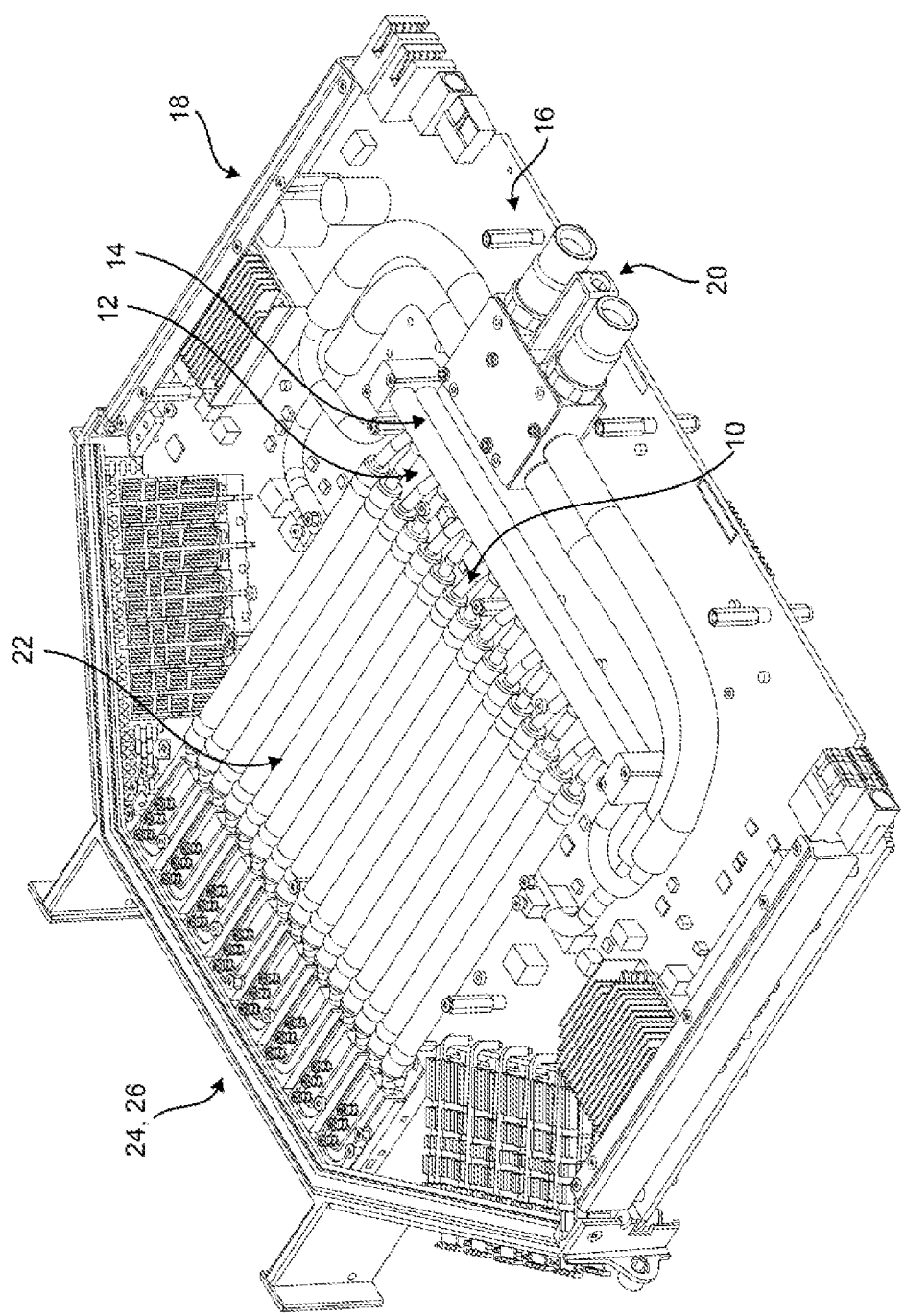
FIG. 1 illustrates a conventional coolant distribution manifold utilizing two plenums assembled to the PCB of a module or circuit pack, the coolant distribution manifold occupying a considerable amount of vertical space within the module or circuit pack.

FIG. 1 illustrates a conventional coolant distribution manifold 10 utilizing two plenums, upper 12 and lower 14, assembled to the PCB 16 of a module or circuit pack 18, the coolant distribution manifold 10 occupying a considerable amount of vertical space within the module or circuit pack 18. One of the upper plenum 12 and the lower plenum 14 acts as a source plenum or path for providing cool coolant from a connector assembly 20 couplable to a coolant distribution unit associated with a shelf assembly or the like to a plurality of coolant lines 22 that feed the associated cooling plates 24 used to cool the pluggable optical modules 26 when inserted into the faceplate or other surface of the module or circuit pack 18. The other of the upper plenum 12 and the lower plenum 14 acts as a return plenum or path for providing heated coolant from the plurality of coolant lines 22 to the connector assembly 20. As illustrated, the upper plenum 12 and the lower plenum 14 are separate, stacked components or paths that take up a considerable amount of vertical space within the module or circuit pack 18, vertical space which is not always available and is desirable to minimize. Further, it is desirable that the parallel coolant flows delivered to the cooling plates 24 and pluggable optical modules 26 be relatively even and that problematic pressure drops from source end to return end be avoided.

Figure 2:
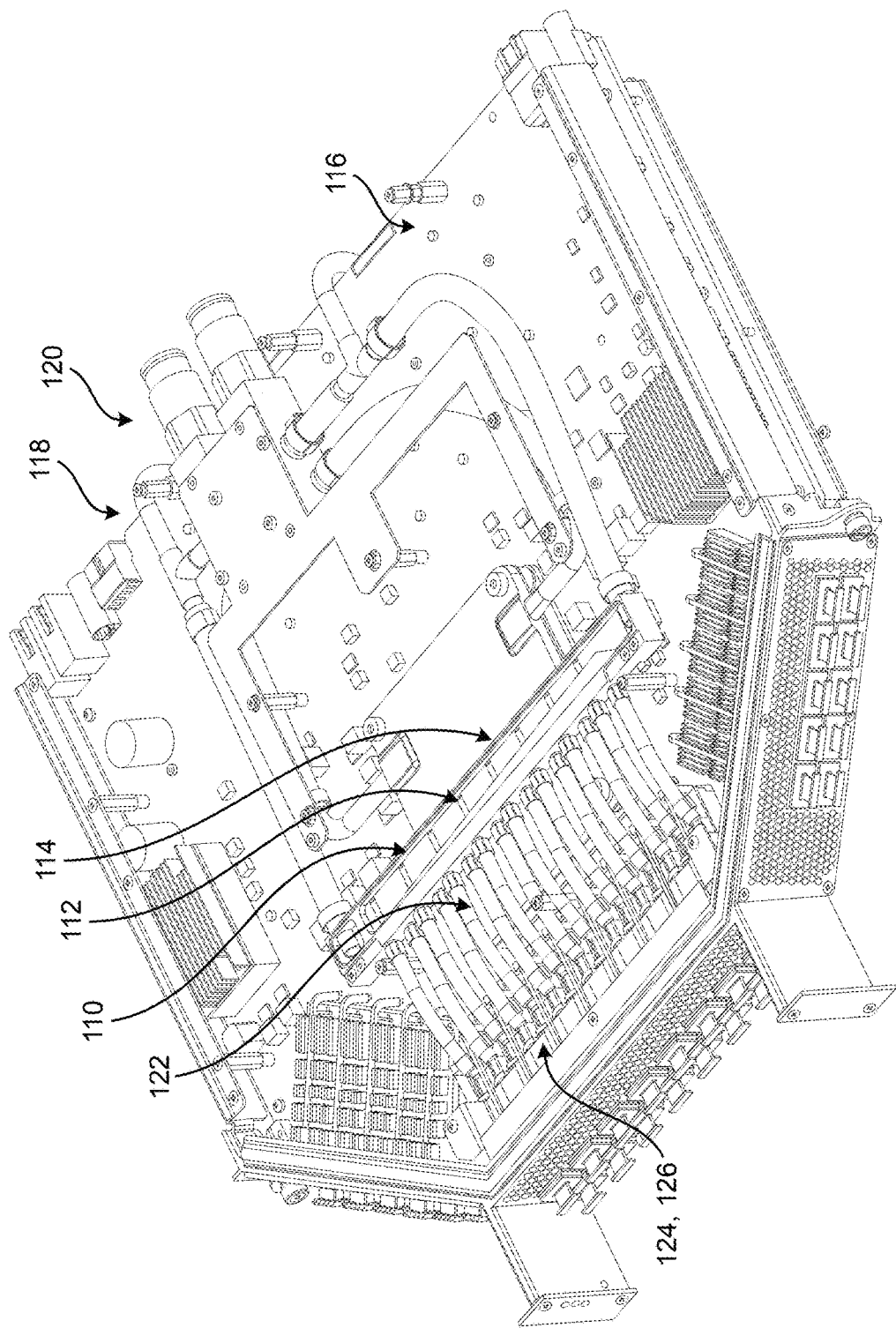
FIG. 2 illustrates one embodiment of the coolant distribution manifold of the present disclosure utilizing two plenums assembled to the PCB of a module or circuit pack, the coolant distribution manifold occupying significantly less vertical space within the module or circuit pack.

FIG. 2 illustrates one embodiment of the coolant distribution manifold 110 of the present disclosure utilizing two plenums, upper 112 and lower 114, assembled to the PCB 116 of a module or circuit pack 118 in a unitary body 130, the coolant distribution manifold 110 thus occupying a smaller amount of vertical space within the module or circuit pack 118. Again, one of the upper plenum 112 and the lower plenum 114 acts as a source plenum or path for providing cool coolant from a connector assembly 120 couplable to a coolant distribution unit associated with a shelf assembly or the like to a plurality of coolant lines 122 that feed the associated cooling plates 124 used to cool the pluggable optical modules 126 when inserted into the faceplate or other surface of the module or circuit pack 118. The other of the upper plenum 112 and the lower plenum 114 acts as a return plenum or path for providing heated coolant from the plurality of coolant lines 122 to the connector assembly 120. As illustrated, the upper plenum 112 and the lower plenum 114 are coupled components or paths that take up considerably less vertical space within the module or circuit pack 118. Further, the parallel coolant flows delivered to the cooling plates 124 and pluggable optical modules 126 are relatively even and problematic pressure drops from source end to return end are avoided.

Figure 3:
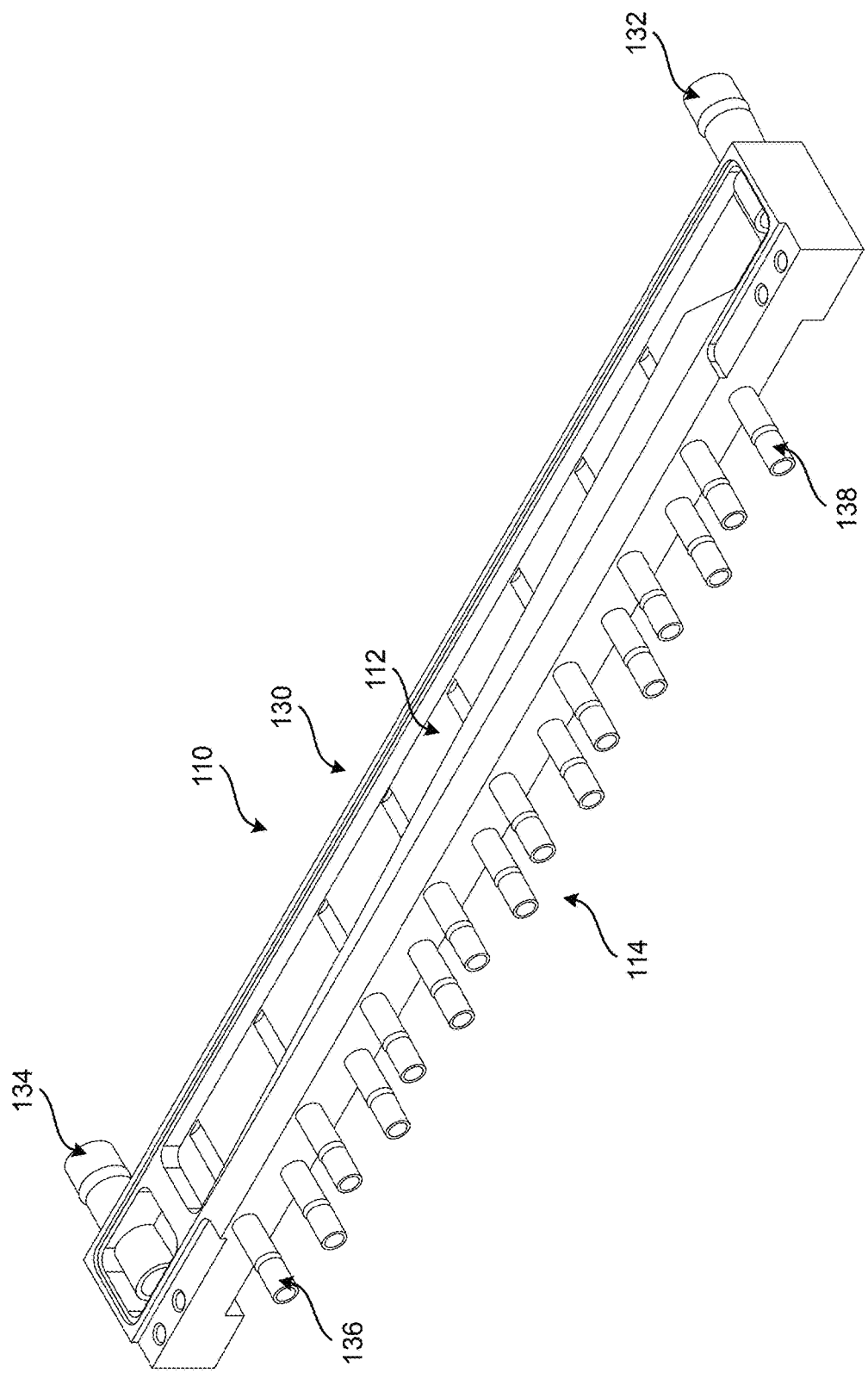
FIG. 3 illustrates one embodiment of the coolant distribution manifold assembly of the present disclosure.

FIG. 3 illustrates one embodiment of the coolant distribution manifold assembly 110 of the present disclosure. The coolant distribution manifold assembly 110 includes a body 130 defining an internal upper coolant flow path 112 and an internal lower coolant flow path 114, adapted to carry cool source coolant flow and heated return coolant flow. The body 130 includes a main inlet port/tube 132 in fluid communication with the inlet flow path (whichever is utilized) and a main outlet port/tube 134 in fluid communication with the outlet flow path (whichever is utilized). Cooling plate inlet ports/tubes 136 are provided along the length of the body 130 for feeding fresh coolant to the various coolant lines 122 in parallel. Cooling plate outlet ports/tubes 138 are provided along the length of the body 130 for receiving return coolant from the various coolant lines 122 in parallel. The body 130 and other components may be manufactured from any suitable rigid metallic or plastic material that is molded, cast, milled, and/or machined to have a desired internal and external shape, and may be formed as one component or assembled from multiple components, provided that the coolant distribution manifold assembly 130 forms a unitary structure for assembly into the module or circuit pack 118 having a controlled and minimized height. All of the ports 132,134,136,138 may include holes manufactured or machined into the body 130, as well as tubes disposed in the holes. The body 130 may include/define any appropriate attachment points for coupling the coolant distribution manifold assembly 110 to the PCB 116. FIG. 3 illustrates the coolant distribution manifold assembly 110 with the top removed from the body 130, exposing the upper coolant flow path 112, which as a tapered or variable width and/or depth (cross-sectional area) along the length of the body 130 between the inlet end and the outlet end. This variation serves to equalize and control the fluid pressure and flow associated with each of the cooling plate inlet/outlet ports/tubes 136,138, as the fluid flows along the body 130 in each of the upper plenum 112 and the lower plenum 114, which flows are isolated from one another. The vertical offset of the milled pockets minimizes the vertical height of the body 130.

Figure 4:
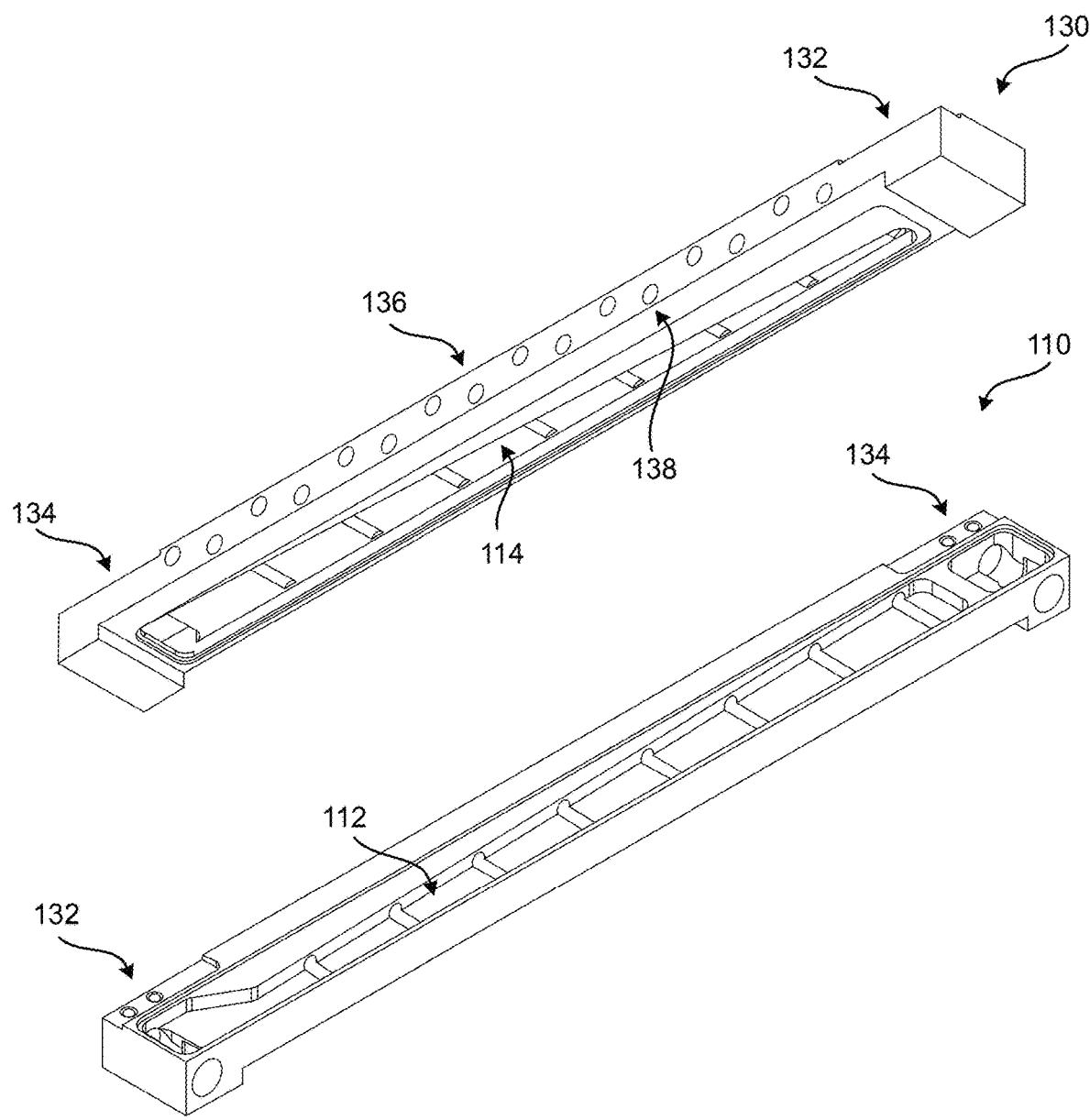
FIG. 4 further illustrates one embodiment of the coolant distribution manifold assembly of the present disclosure.

Referring to FIG. 4, it can be seen that the inlet plenum 112 including the cooling plate inlet ports 136 is manufactured into the upper portion of the body 130 with an increasing cross-sectional area between the inlet end 132 of the body 130 and the outlet end 134 of the body 130, while the outlet plenum 114 including the cooling plate outlet ports 138 is manufactured into the lower portion of the body 130 with an increasing cross-sectional area between the inlet end 132 of the body 130 and the outlet end 134 of the body 130. It will be readily apparent to those of ordinary skill in the art that other vertical placements and path area variations may be used as desired in a given application to provide a given flow/pressure/temperature profile. All fluid flows into the inlet plenum 112, through a given cooling plate inlet port 136, through the associated cooling plate outlet port 138, and out of the outlet plenum 114. As is illustrated, the walls defining the various cooling plate inlet/outlet ports 136,138 may protrude into the opposite of the inlet/outlet plenum 112,114 to a degree within the interior of the body 130 to conserve vertical space.

Figure 5:
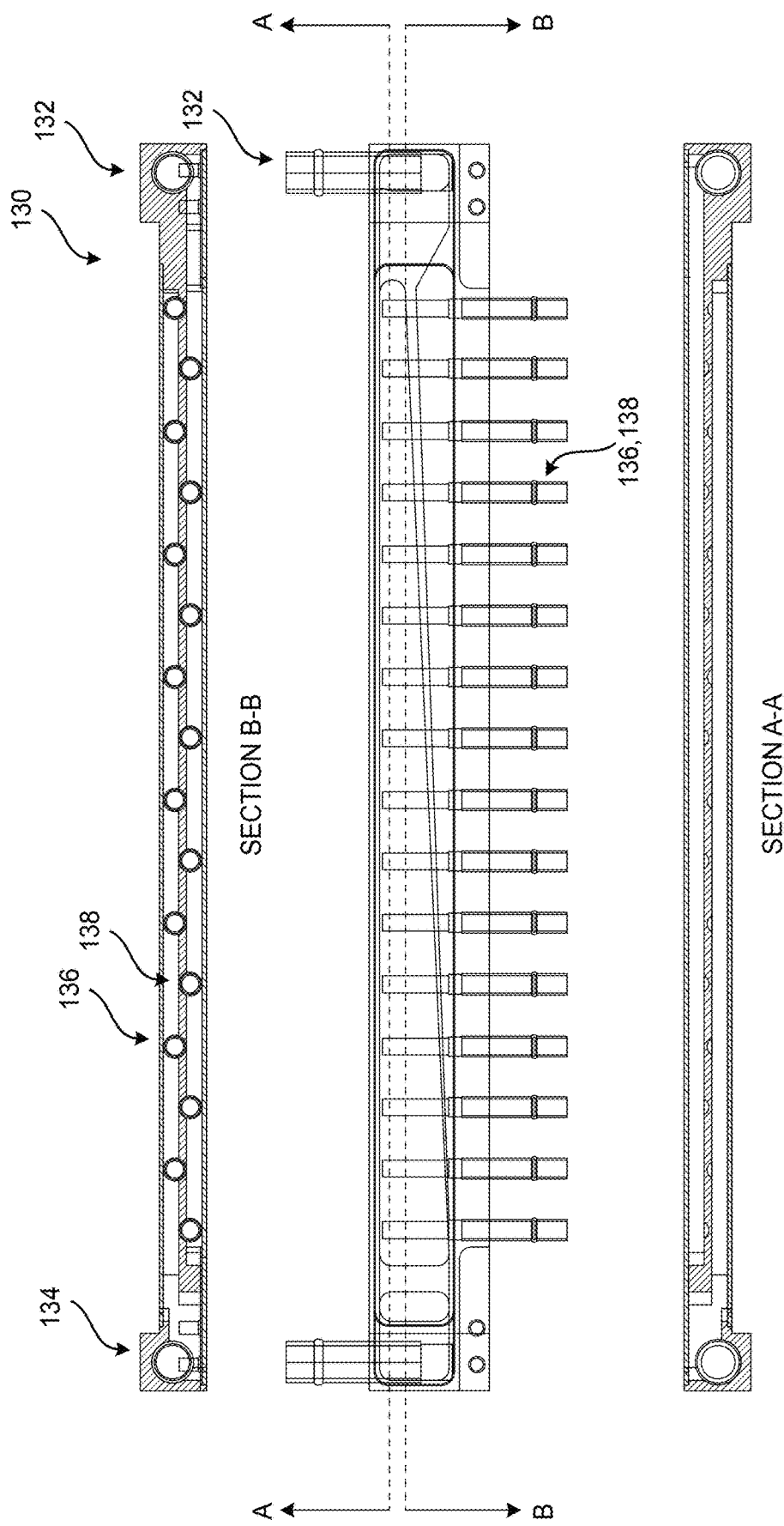
FIG. 5 further illustrates one embodiment of the coolant distribution manifold assembly of the present disclosure.

Referring to FIG. 5, it can be seen that the cooling plate inlet ports 136 and cooling plate outlet ports 138 may be offset and staggered along the end-to-end length of the body 130 between the main inlet port 132 and the main outlet port 134, as well as offset vertically, again to conserve vertical space. Each of the ports 132,134,136,138 may include a tube that makes rapid sealing connections to the various ports 132,134,136,138 easier.

Figure 6:
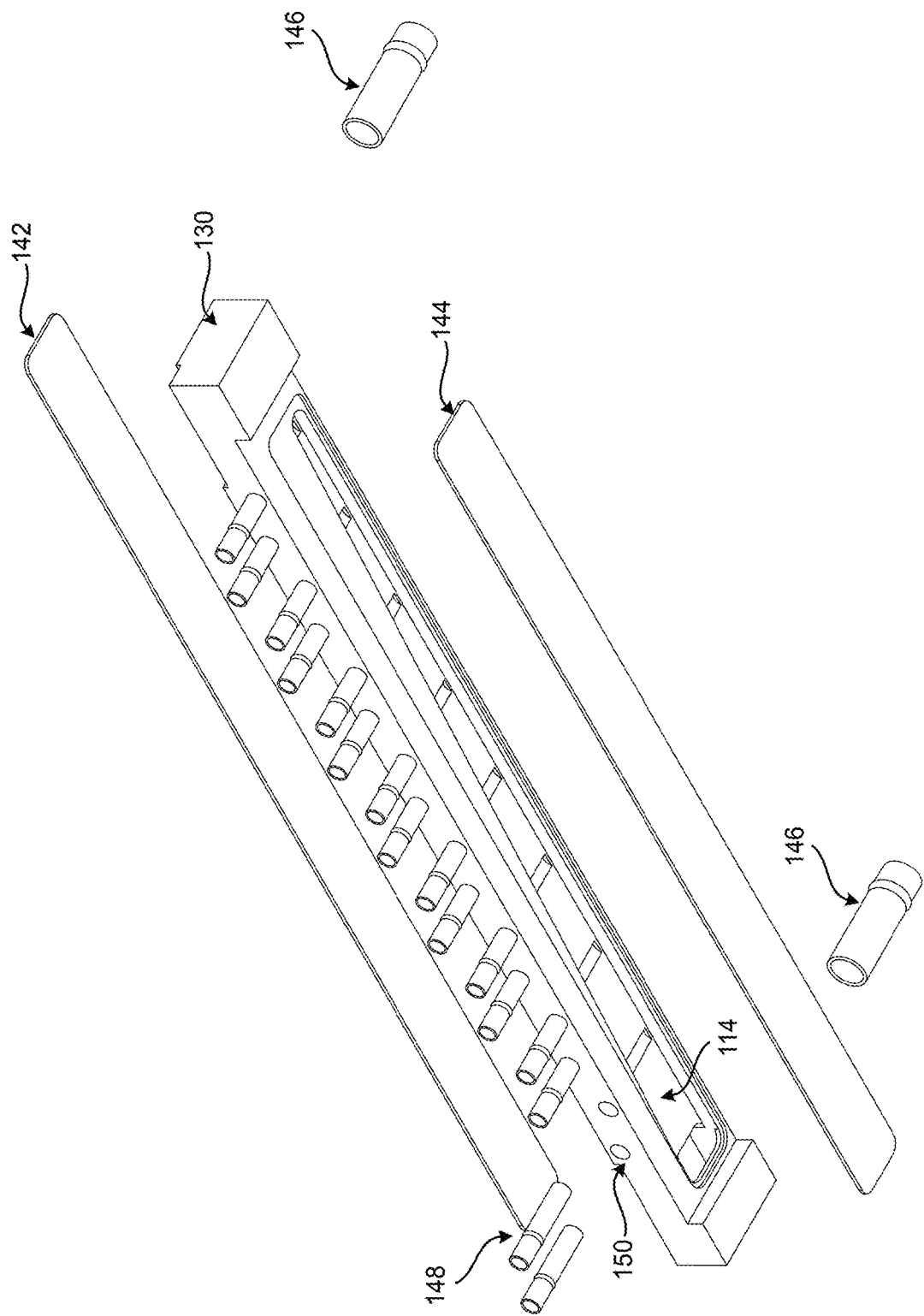
FIG. 6 further illustrates one embodiment of the coolant distribution manifold assembly of the present disclosure.

Referring to FIG. 6, the milled channels of the upper and lower plenums 112,114 are enclosed with upper and lower covers 142,144 that are affixed to the body 130, such as with an adhesive or by soldering or brazing. As alluded to above, tubes 146,148 may be sealingly inserted into the various port holes 150 to make rapid sealing connections to the various ports 132,134,136,138 easier.

The tapered shape of the distribution channels is used because, without the taper, i.e. with uniform inlet and outlet channel cross-sections, there is port-to-port variation in port flow rate that is preferable to eliminate. The general idea of the taper is to control the fluid flow and pressure fields, which are non-uniform, within the region of the inlet and outlet channels, with the ideal goal of delivering a consistent flow rate to all ports. On the inlet side, this is achieved by using a larger channel cross-section where the channel flow rate is highest, graduating to a smaller channel cross-section where channel flow rate is lowest. On the outlet side, a similar strategy, or variation of this strategy, can also be used, provided that given flow rate distribution goals are achieved. A taper may vary linearly, but not necessarily so. The taper may increase/decrease monotonically, but not necessarily so. While the cross-section variation is achieved by modifying the width of the channel, it may also be achieved by modifying the height of the channel and/or the shape of the channel, and each channel need not be rectangular.

Figure 7A:
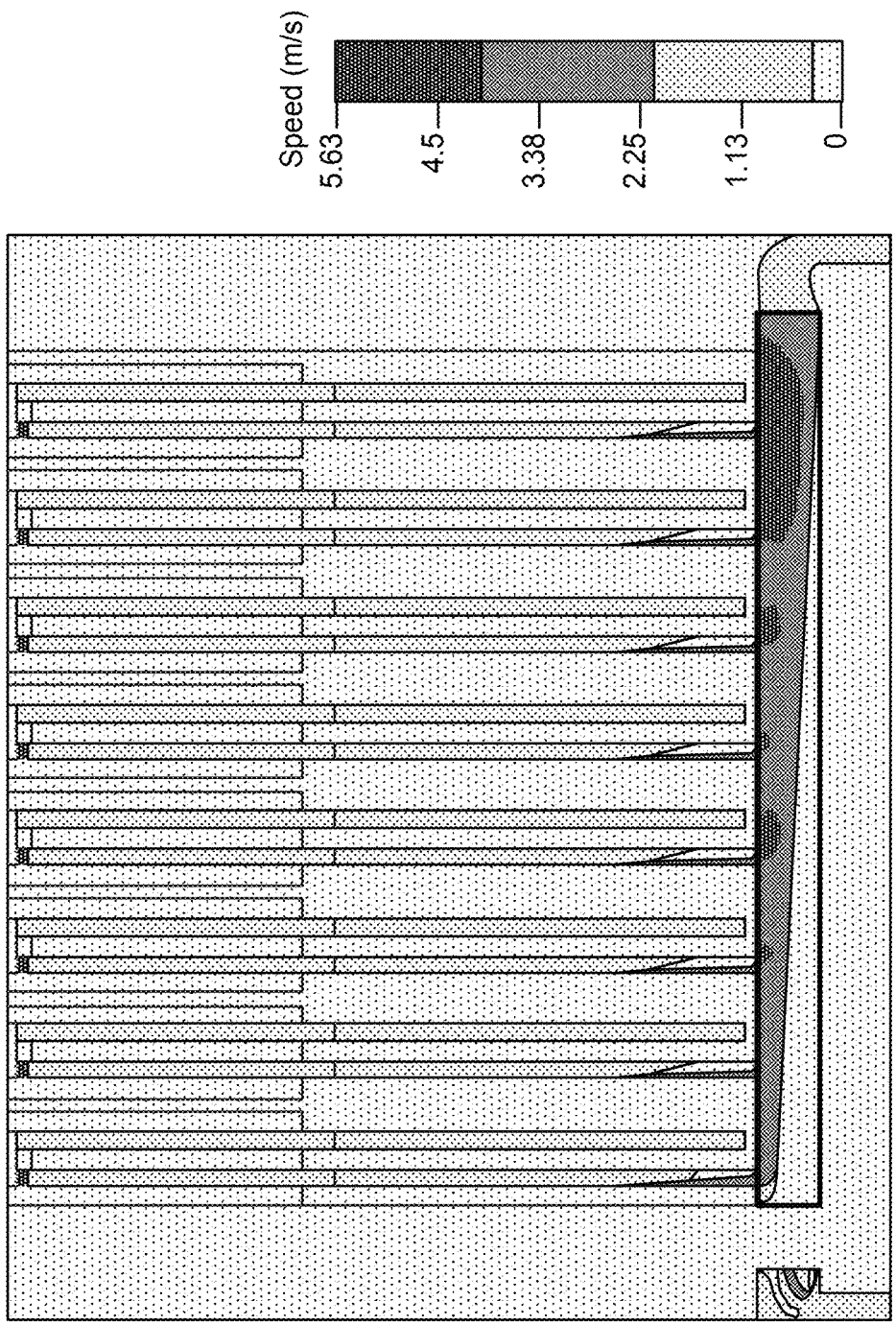
FIG. 7A illustrates the fluid flow associated with one embodiment of the coolant distribution manifold assembly of the present disclosure showing a plane through the inlet channel of the embodiment of the coolant distribution manifold assembly.
Figure 7B:
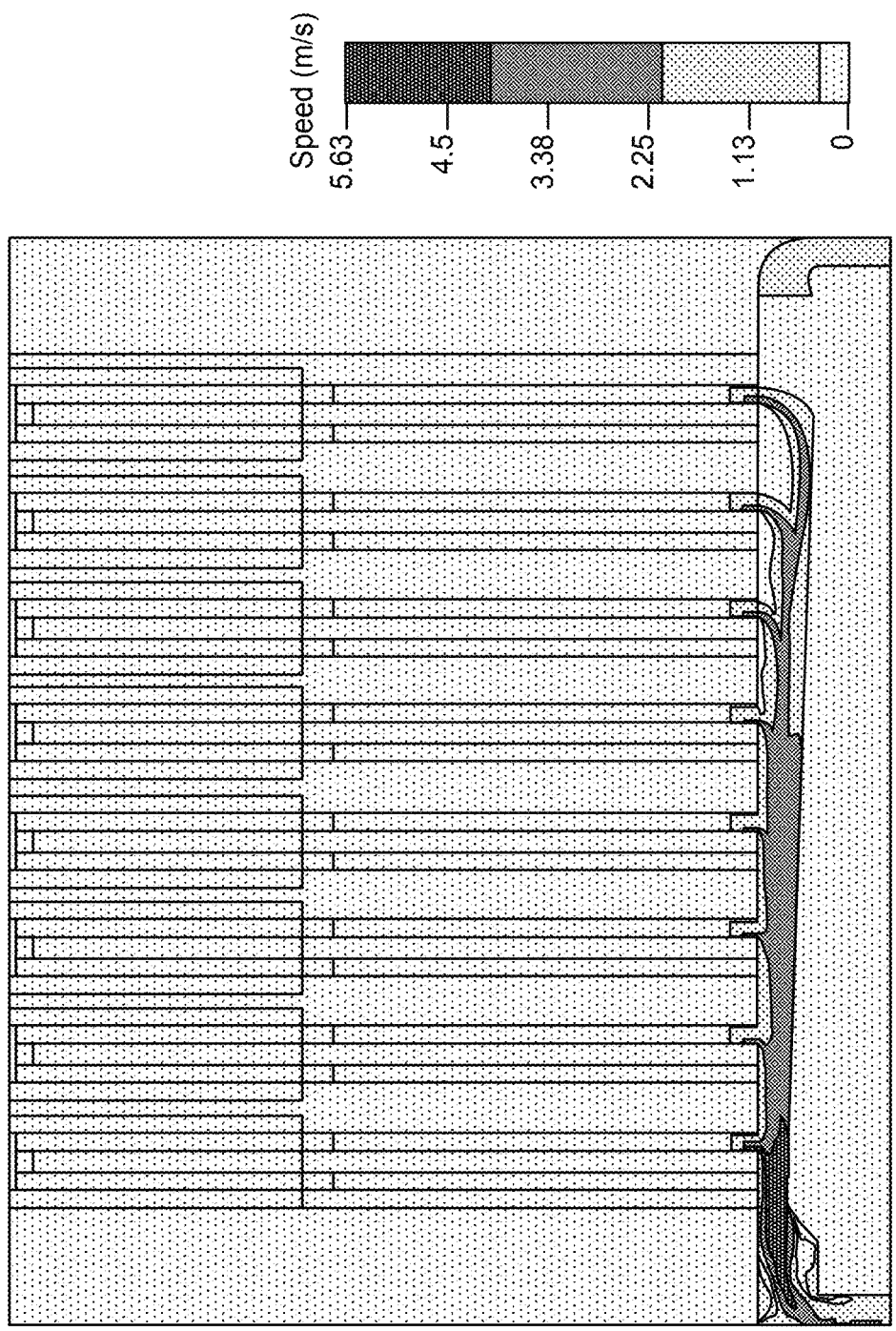
FIG. 7B illustrates the fluid flow associated with one embodiment of the coolant distribution manifold assembly of the present disclosure showing a plane through the outlet channel of the embodiment of the coolant distribution manifold assembly.

FIG. 7 illustrate the fluid flow associated with one embodiment of the coolant distribution manifold assembly 110 of the present disclosure, with FIG. 7A depicting a plane through the inlet channel and FIG. 7B depicting a plane though the outlet channel. It can be seen that the flow is evened out port-to-port with tapered channels 112,114.

Figure 8A:
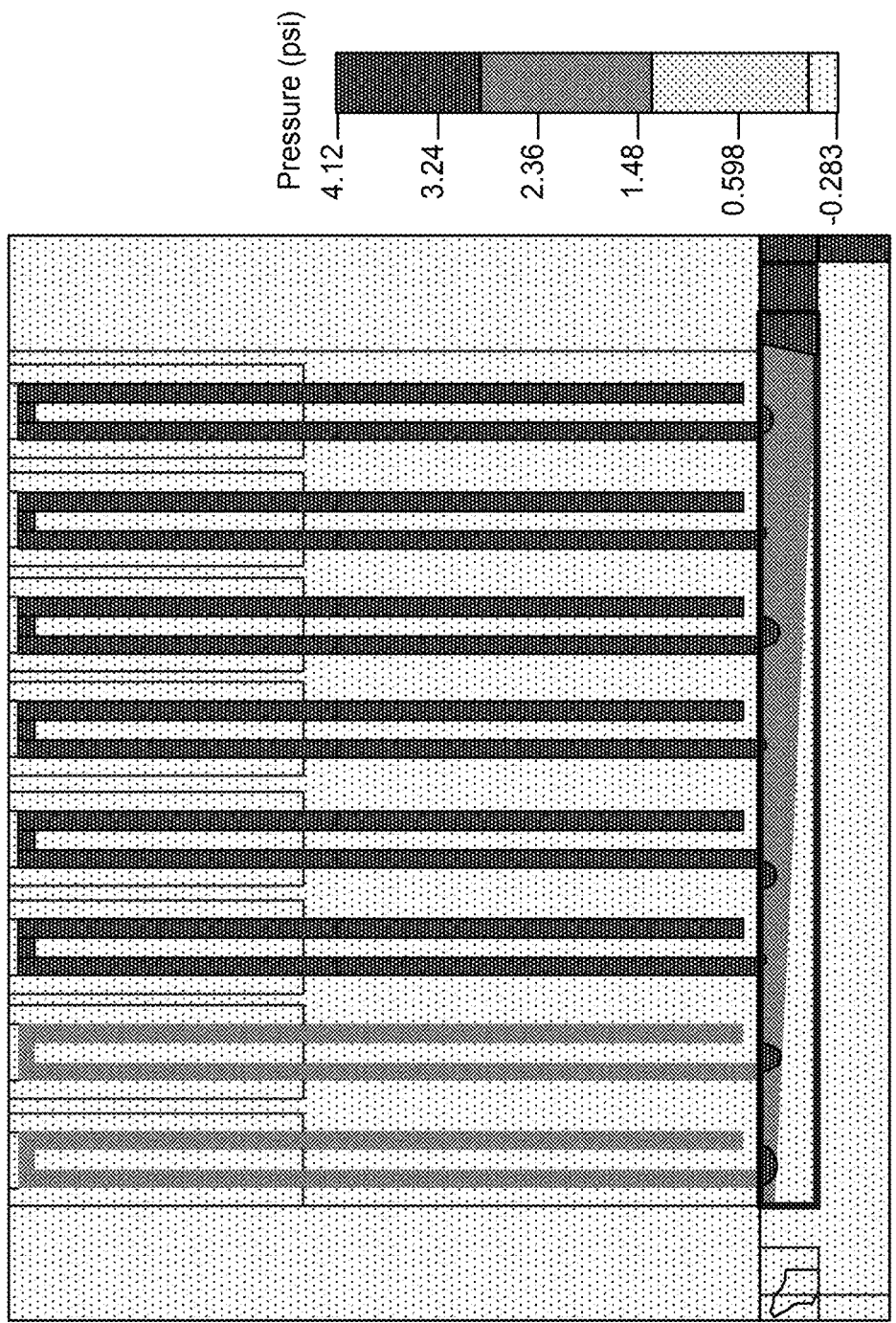
FIG. 8A illustrates the fluid pressure distribution associated with one embodiment of the coolant distribution manifold assembly of the present disclosure showing a plane through the inlet channel of the embodiment of the coolant distribution manifold assembly.
Figure 8B:
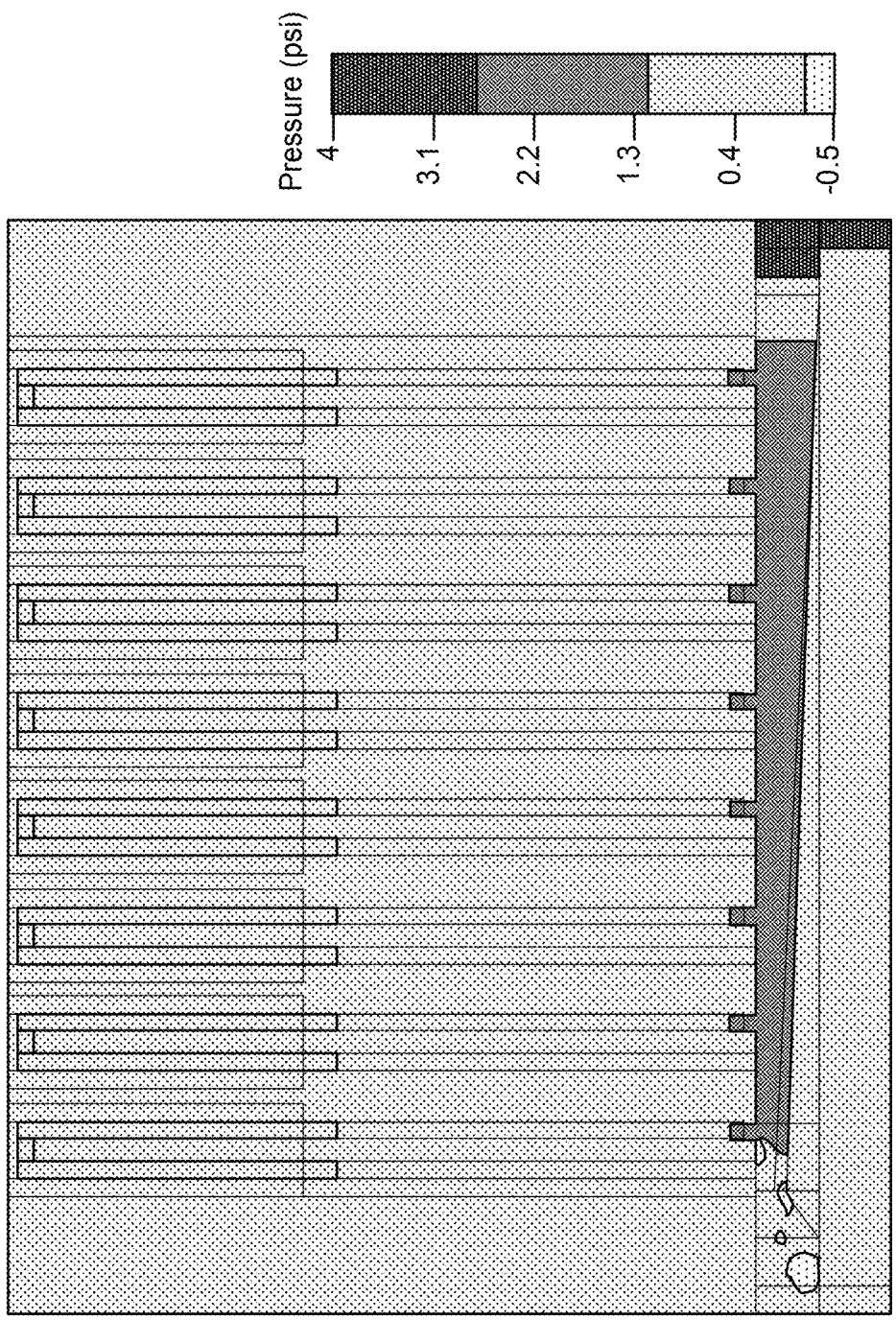
FIG. 8B illustrates the fluid pressure distribution associated with one embodiment of the coolant distribution manifold assembly of the present disclosure showing a plane through the outlet channel of the embodiment of the coolant distribution manifold assembly.

FIG. 8 illustrate the fluid pressure distribution associated with one embodiment of the coolant distribution manifold assembly 110 of the present disclosure, with FIG. 8A depicting a plane through the inlet channel and FIG. 8B depicting a plane though the outlet channel. The flow distribution pressure was analyzed with respect to tapered channels 112,114 that even the flow speed. The result for the geometry analyzed was a small increase in overall pressure drop across the manifold 110. The taper therefore benefits the flow speed distribution to each port 136,138 to even out port temperatures but can possibly have the adverse effect of higher delta P across the manifold 110.

Figure 9A:
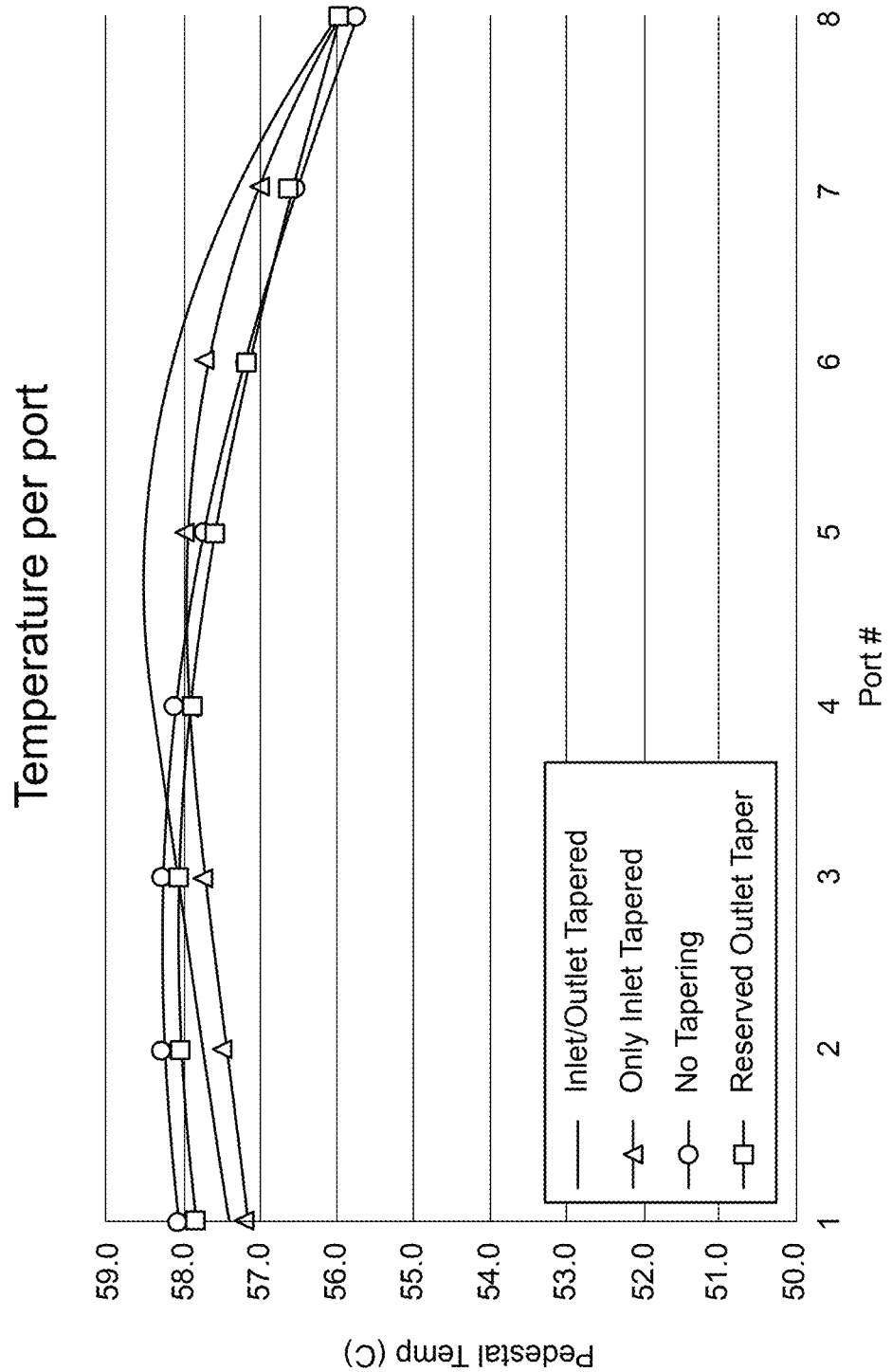
FIG. 9A illustrates the temperature versus port associated with one embodiment of the coolant distribution manifold assembly of the present disclosure.

FIG. 9A illustrates the temperature versus port associated with one embodiment of the coolant distribution manifold assembly 110 of the present disclosure.

Figure 9B:
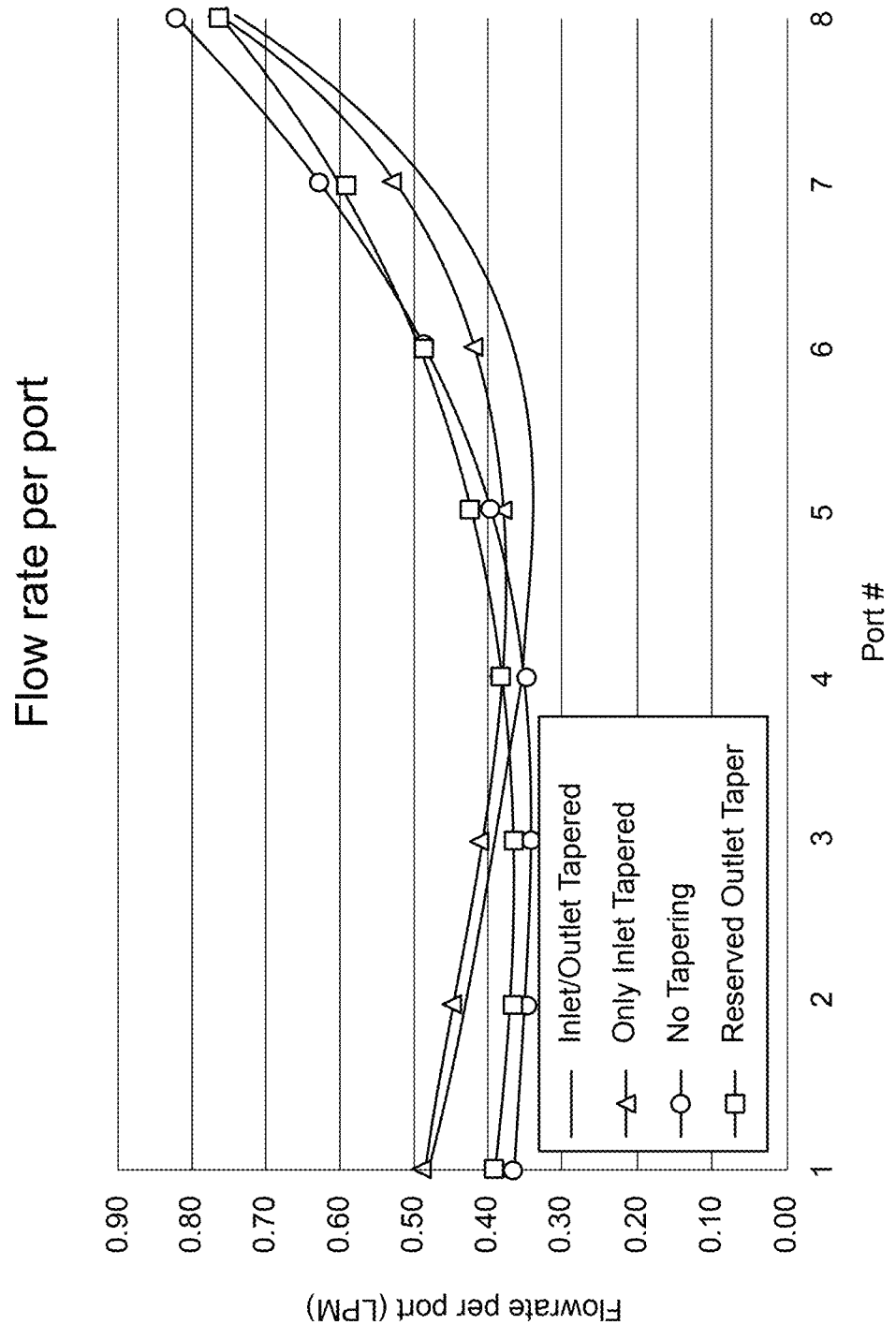
FIG. 9B illustrates the flow rate versus port associated with one embodiment of the coolant distribution manifold assembly of the present disclosure.

FIG. 9B illustrates the flow rate versus port associated with one embodiment of the coolant distribution manifold assembly 110 of the present disclosure.

Figure 10:
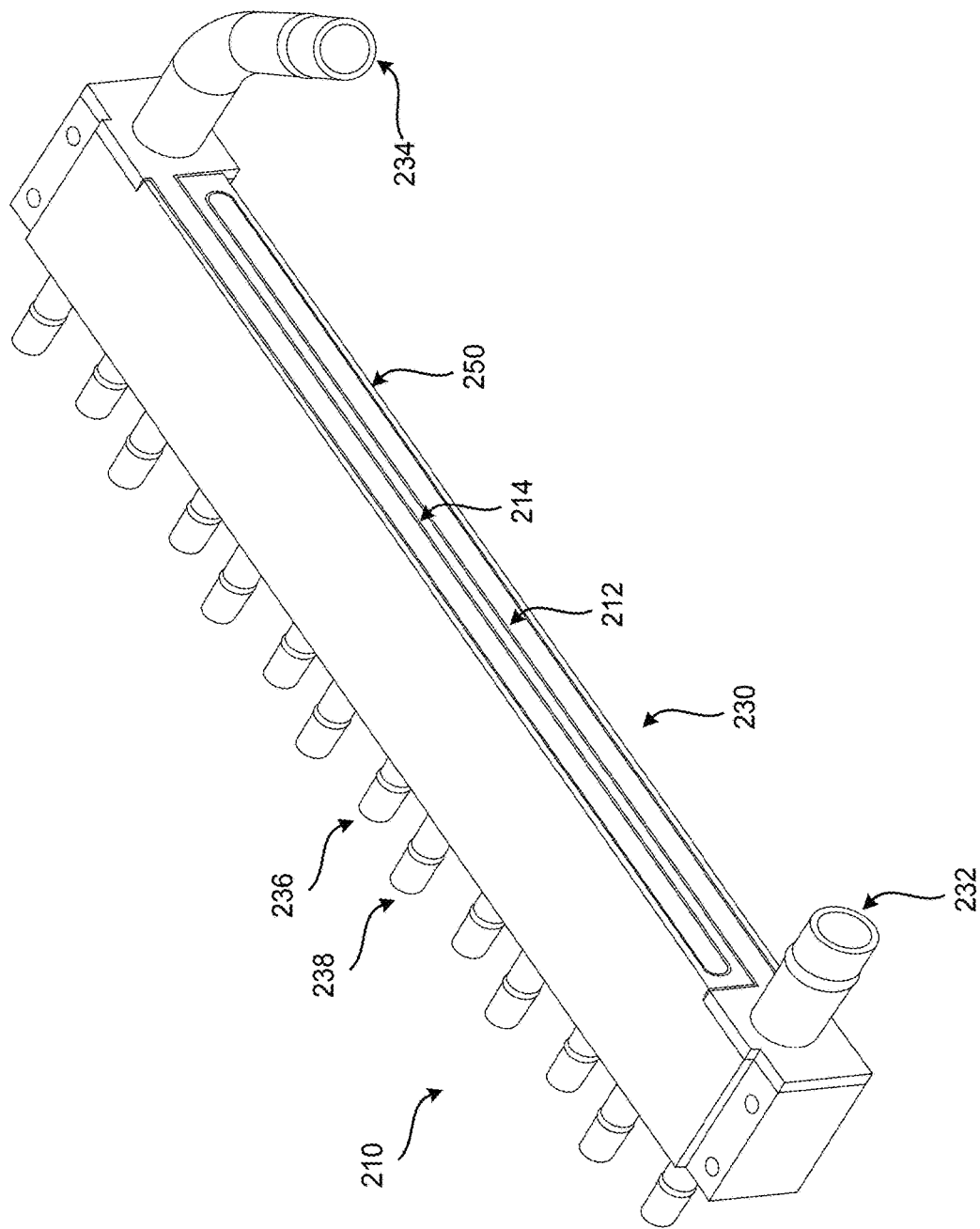
FIG. 10 illustrates another embodiment of the coolant distribution manifold assembly of the present disclosure.
Figure 11:
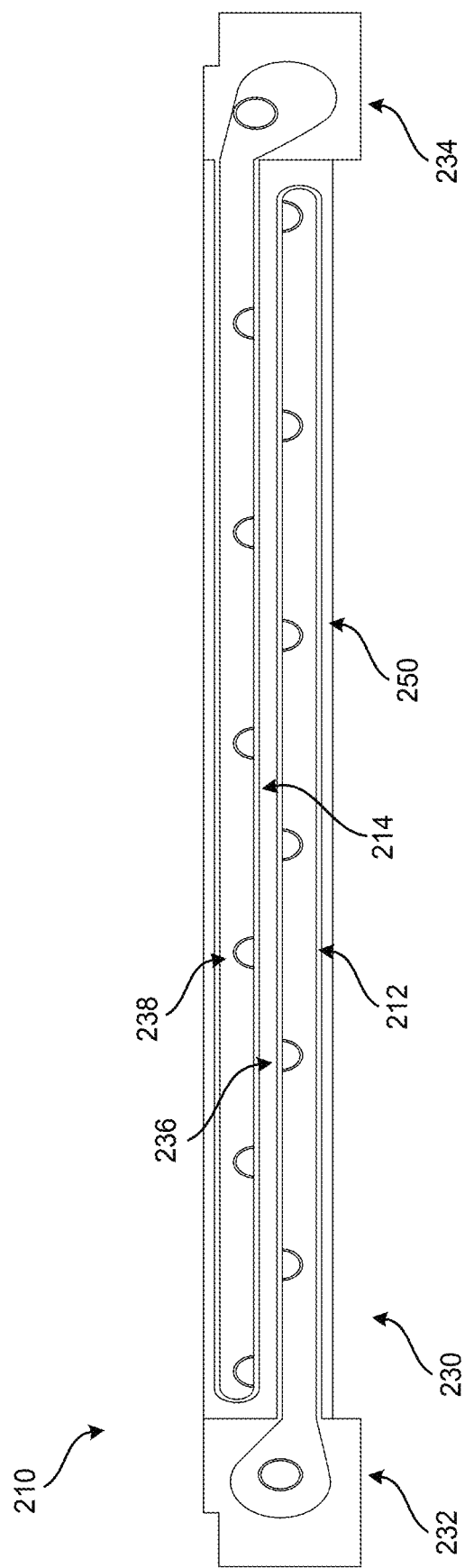
FIG. 11 further illustrates another embodiment of the coolant distribution manifold assembly of the present disclosure.

FIGS. 10 and 11 illustrate another embodiment of the coolant distribution manifold 210 assembly of the present disclosure. The coolant distribution manifold assembly 210 again includes a body 230 defining an internal lower coolant flow path 212 and an internal upper coolant flow path 214, adapted to carry cool source coolant flow and heated return coolant flow. Here, where flow speed equalization across ports and a tapered channel are not needed, both flow paths 212,214 are milled from one side of the body 230 to reduce setup costs. The body 230 again includes a main inlet port/tube 232 in fluid communication with the inlet flow path (whichever is utilized) and a main outlet port/tube 234 in fluid communication with the outlet flow path (whichever is utilized). Cooling plate inlet ports/tubes 236 are provided along the length of the body 230 for feeding fresh coolant to the various coolant lines 222 in parallel. Cooling plate outlet ports/tubes 238 are provided along the length of the body 230 for receiving return coolant from the various coolant lines 222 in parallel. The body 230 and other components may again be manufactured from any suitable rigid metallic or plastic material that is molded, cast, milled, and/or machined to have a desired internal and external shape, and may be formed as one component or assembled from multiple components, provided that the coolant distribution manifold assembly 230 forms a unitary structure for assembly into the module or circuit pack 118 having a controlled and minimized height. All of the ports 232,234,236,238 may include holes manufactured or machined into the body 230, as well as tubes disposed in the holes. The body 230 may include/define any appropriate attachment points for coupling the coolant distribution manifold assembly 210 to the PCB 216. The vertical offset of the milled pockets minimizes the vertical height of the body 230. Covers 250 are again provided to seal the channels 212,214, in this case at the side of the body 230.

Figure 12:
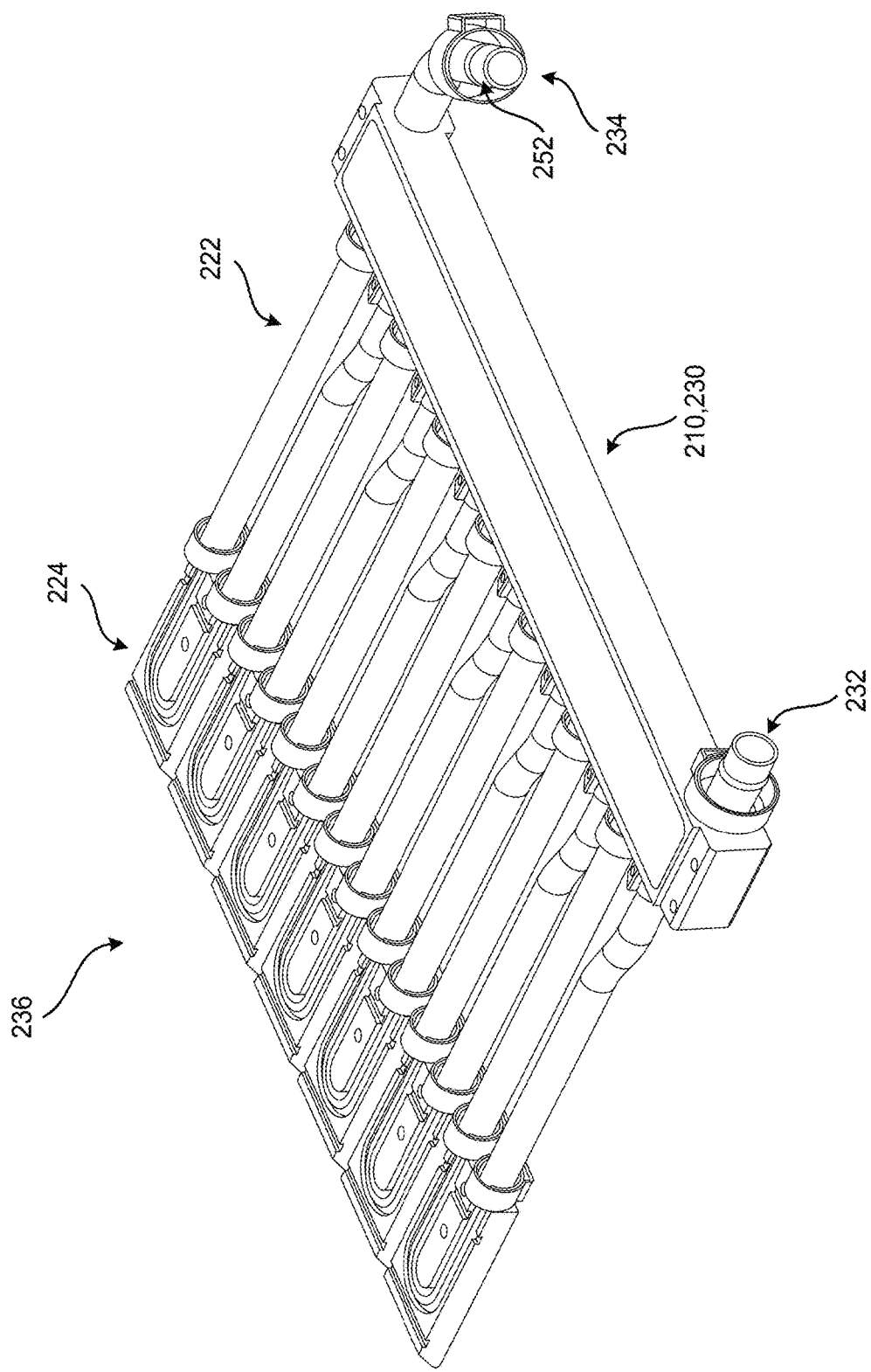
FIG. 12 further illustrates another embodiment of the coolant distribution manifold assembly of the present disclosure.
Figure 13:
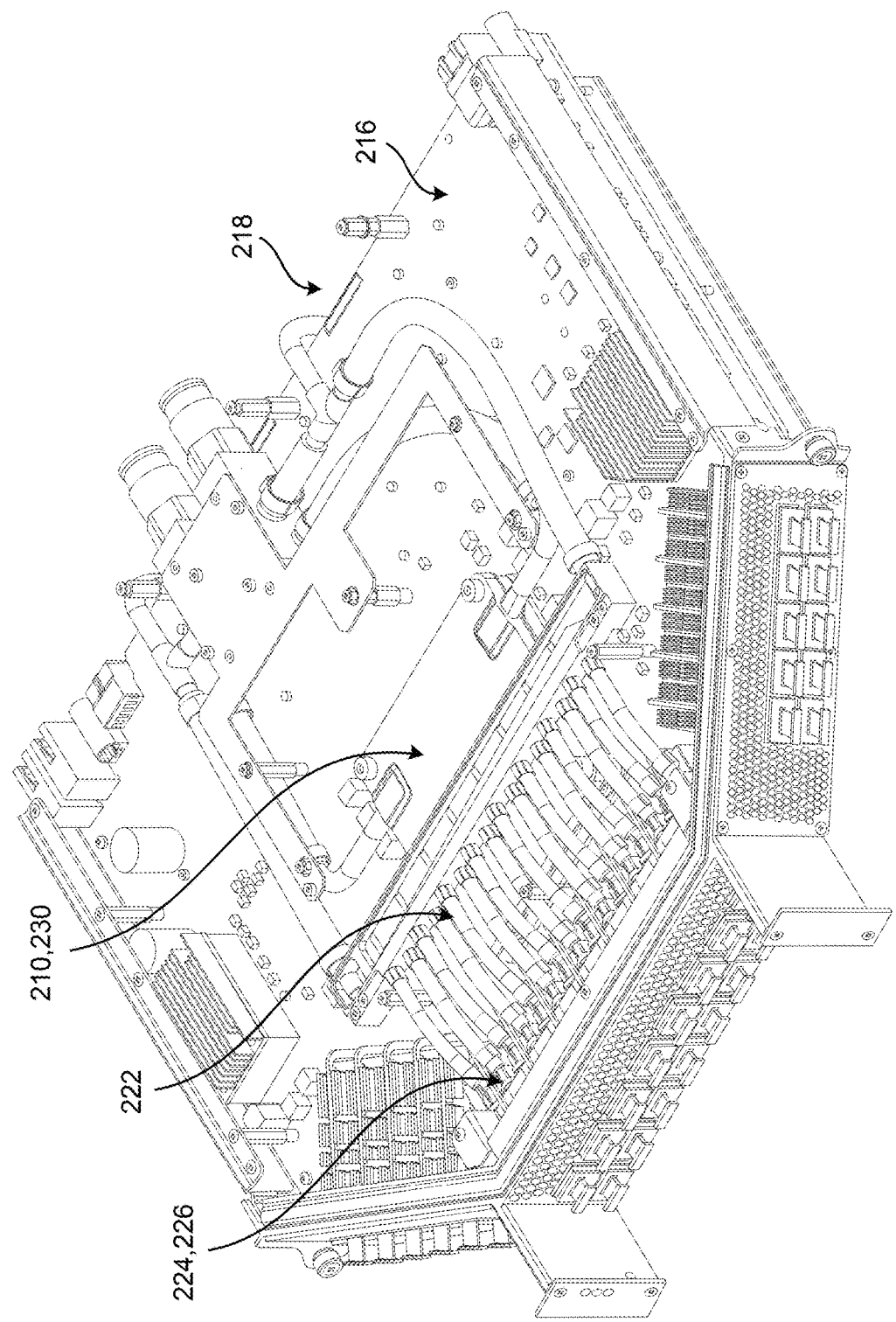
FIG. 13 again illustrates one embodiment of the coolant distribution manifold of the present disclosure utilizing two plenums assembled to the PCB of a module or circuit pack, the coolant distribution manifold occupying significantly less vertical space within the module or circuit pack.

FIGS. 12 and 13 illustrate the coolant distribution manifold assembly 210 of the present disclosure coupled to the associated coolant lines 222 and cooling plates 224. As illustrated, various clamp devices 252 may be used to secure the tubes used to the associated coolant lines. The cooling plates 224 are adapted to cool the pluggable modules 226 disposed through the faceplate of the module or circuit pack 218. Optionally, an arrangement may be used whereby the manifold inlet and outlet ports 232,234 are adjacent to one another. This is of benefit in systems in which space constraints demand that the outlet port 234 and its associated tube run to be co-located with the inlet port 232 and its associated tube; e.g., inlet and outlet tubing run as a parallel pair.

Figure 14:
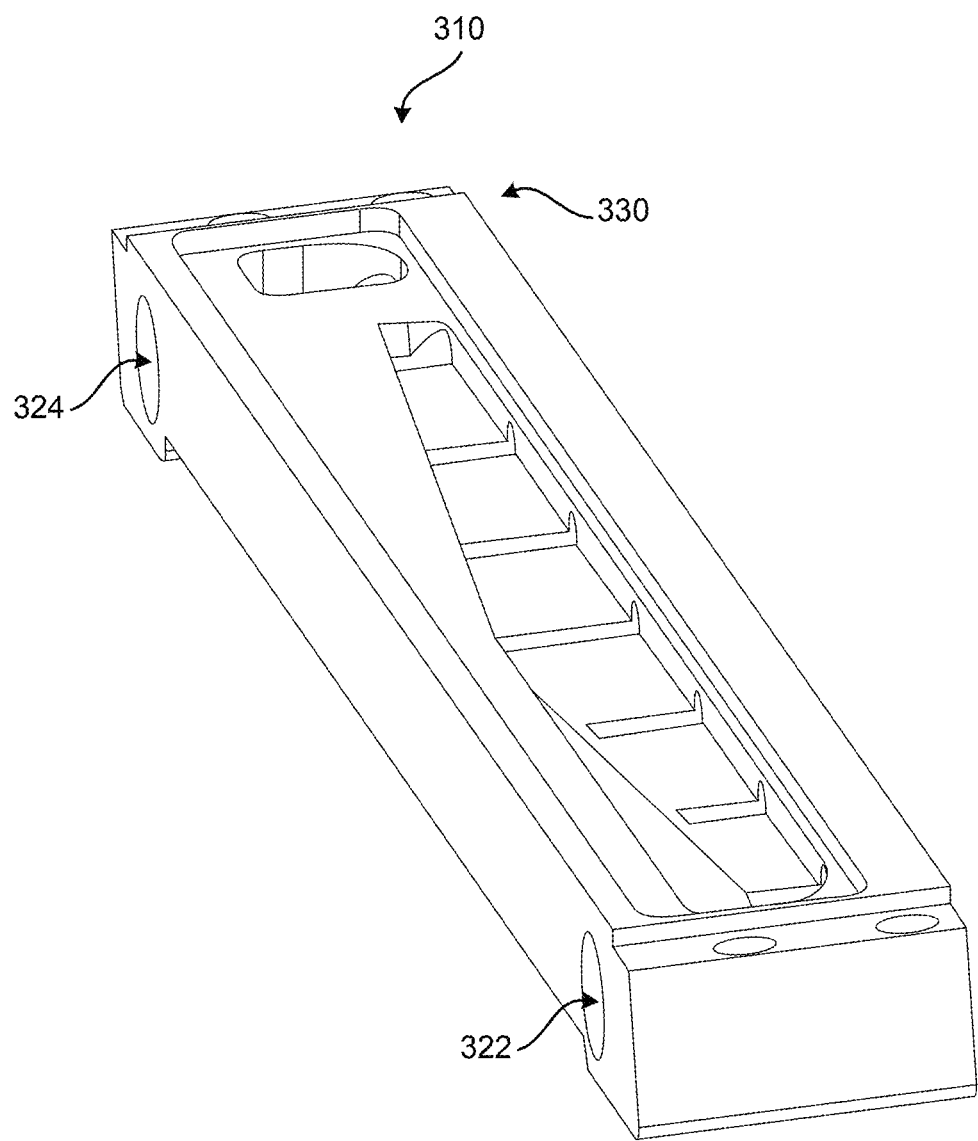
FIG. 14 illustrates a further embodiment of the coolant distribution manifold assembly of the present disclosure.

FIG. 14 illustrates a further embodiment of the coolant distribution manifold assembly 310 of the present disclosure that preserves good pressure and flow characteristics on both the supply 322 and return side 324 of the manifold body 330. The dividing wall 331 between the supply side 322 and the return side 324 is contoured in such a manner that the available cross-sectional area for flow is commensurate with the local flow rate. The guiding principle is that pressure drop-which generally is important to reduce-increases non-linearly with fluid speed, and, in this embodiment, efforts are made to reduce speed particularly where it would otherwise be highest, while allowing speed to increase particularly where it would otherwise be lowest. The trade-off allows for a lower total pressure drop from manifold inlet (supply) 322 to manifold outlet (return) 324.

Figure 15A:
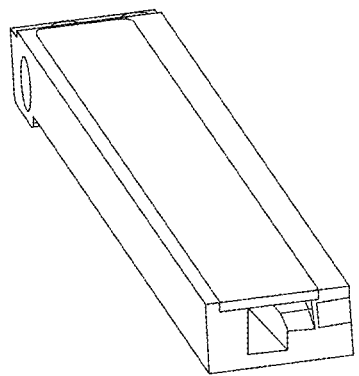
FIG. 15 further illustrate a further embodiment of the coolant distribution manifold assembly of the present disclosure.

Referring to FIGS. 15, the cross-section in FIG. 15a intersects supply port 1 of a multi-port (e.g., 7-port) manifold 310. It is apparent that the cross-section is completely allocated to supply side flow 322, and that no cross-section is made available for return flow 324. This is the most suitable distribution at this section because here 100% of the system flow is carried on the supply side 322, and there is no requirement for the manifold 310 to carry return flow 324. The cross-section in FIG. 15b intersects return port 1. At this position, 86% of the system flow is carried on the supply side 322; i.e., flow for ports 2 through 7, while 14% of the system flow is carried on the return side 324; i.e. port 1 of 7 only. At this position, supply side and return side flow sections are interleaved such that the supply side cross-section is L-shaped, while the return side cross-section is rectangular. The dividing wall 331 can be contoured in numerous different manners, while preserving the intent that the cross-sectional area for flow is commensurate with the local supply and local return flow rates, which are generally different from one another.

Figure 15B:
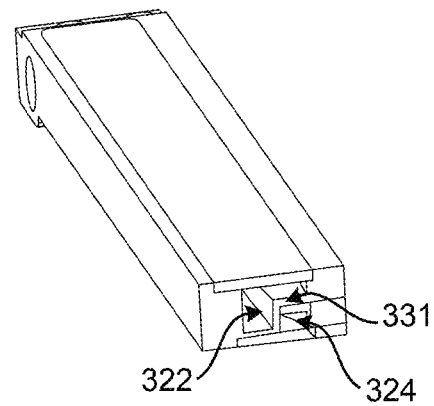
Figure 15C:
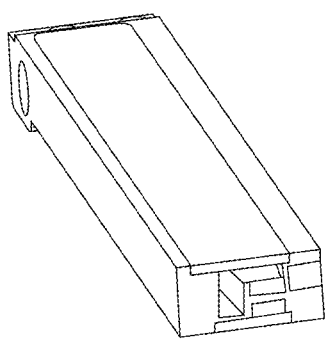
Figure 15D:
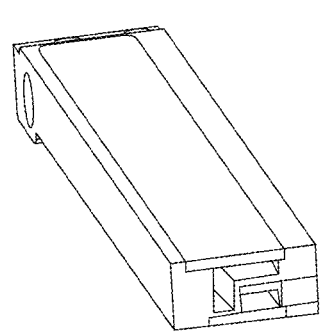

The cross-section in FIG. 15c intersects supply port 2. Here, it is apparent that the supply cross-section is decreased relative to FIG. 15a, and some cross-sectional area is now allocated for the return flow 324. The cross-section in FIG. 15d intersects return port 2. Here, it is apparent that the dividing wall 331 is in a slightly different position from FIG.

15b, the supply cross-section is decreased relative to FIG. 15b, and the return cross-section is increased relative to FIG. 15b.

Figure 15E:
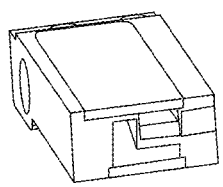
Figure 15F:
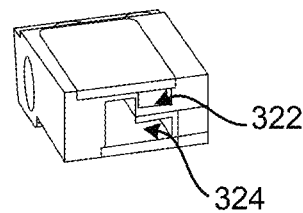

The cross-section in FIG. 15e intersects supply port 6. Here, it is apparent that the trend noted above of decreasing supply cross-section continues. At this position, 29% of the system flow is carried on the supply side 322. The cross-section in FIG. 15f intersects return port 6. Here, it is apparent that the trend noted above of increasing return cross-section continues. At this position, 86% of the system flow is carried on the return side 324. It is also apparent in FIG. 15e and FIG. 15f that the supply cross-section is changed from L-shaped to rectangular, while the return cross-section is changed from rectangular to L-shaped.

Generally, the supply and return cross-sections are interleaved in such a manner as to maximize the total supply and return flow cross-sections, while allocating the supply and return cross-sections unequally with flow rates in consideration, while also minimizing the volume of the dividing wall 331 between them. This is accomplished by varying the shape of the dividing wall 331 in a 3-dimensional (3-D) manner. As an example of the 3-D nature of a possible dividing wall 331, FIG. 16 shows perspective views of the dividing wall 331 proper, using a rounded modified L-shape, with all other manifold features hidden (outer wall, lids, fluid fittings, etc.).

Using this technique, the pressure drop through the manifold 310 can be reduced by 50% as compared to conventional dividing wall geometries. The advantages of doing this are one or a combination of the following: lower system pressure, lower pumping power, greater total flow, greater flow per port, improved port-to-port flow uniformity, and lower pluggable optical module temperature.

In several further embodiments, the manifold can be designed to both serve the purpose of controlling the flow in a manner such that the port-to-port flow differences are reduced while preserving a low hydraulic resistance (i.e., low pressure drop). The embodiments illustrated and described are example 8-port manifolds with tapered sections, using the more complex 3-D tapering implementation described above.

Figure 17:
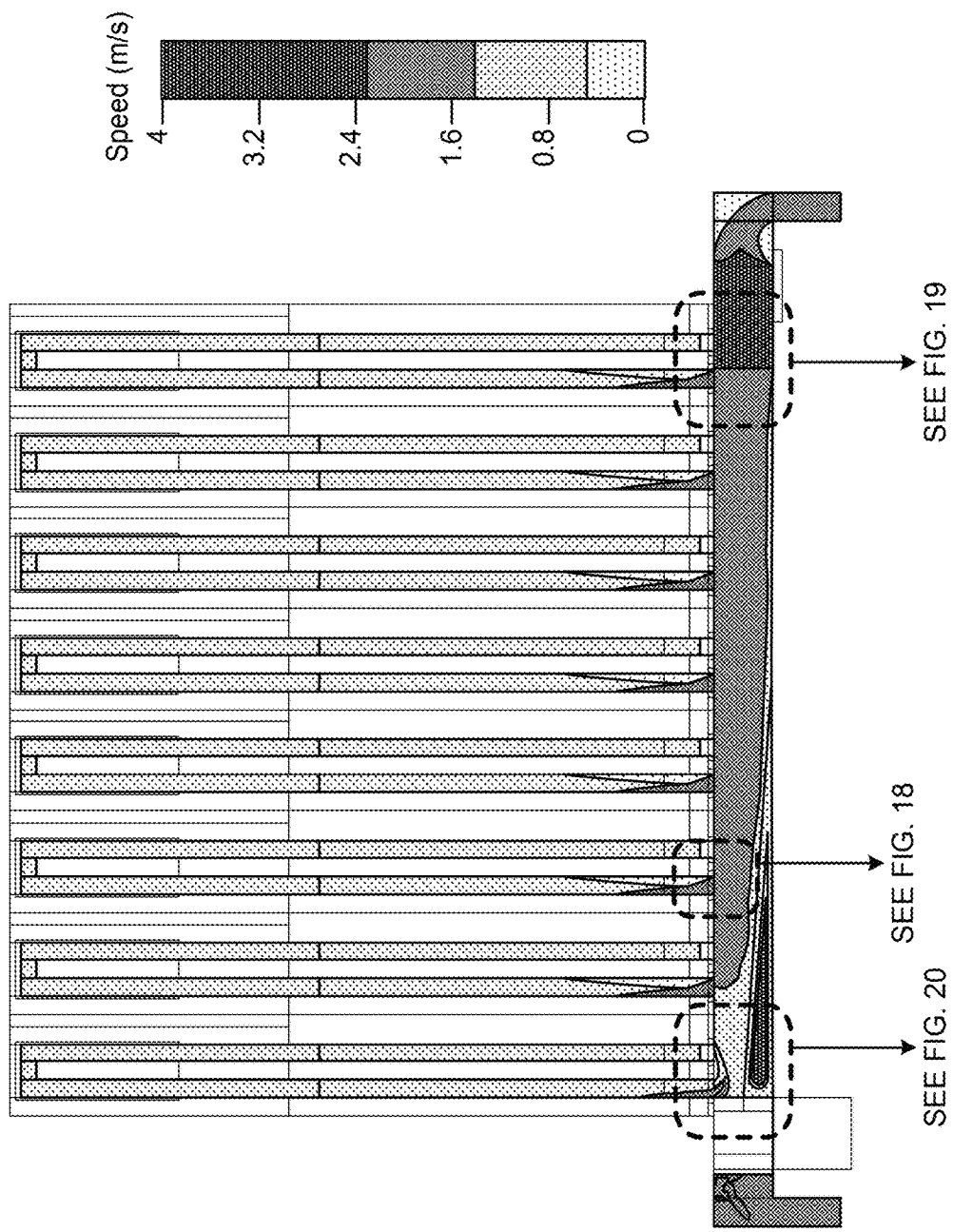
FIG. 17 illustrates the fluid flow associated with a still further embodiment of the coolant distribution manifold assembly of the present disclosure.
Figure 18:
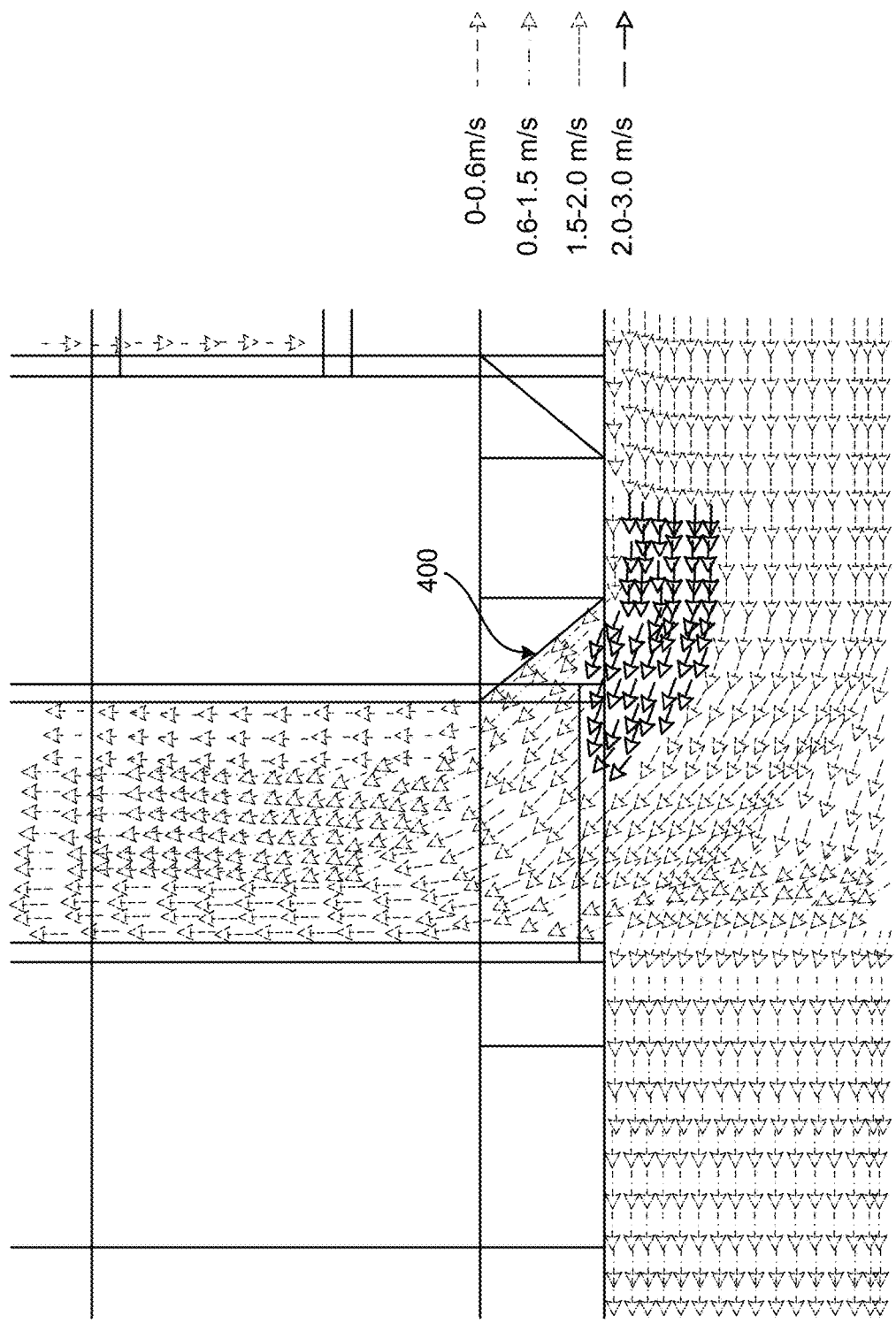
FIG. 18 further illustrates the fluid flow associated with a still further embodiment of the coolant distribution manifold assembly of the present disclosure.

For example, the inlet to each port may be constructed with a lead-in feature 400. In the flow model, the feature 400 was modeled as a 1.5-mm×45° chamfer. FIG. 17 and FIG. 18 show a section through the supply ports of the manifold, and flow speed is displayed. The lead-in feature 400 serves to reduce the hydraulic resistance of the flow transition from the manifold supply channel to the port channel. Doing so has the overall benefit of reducing total manifold hydraulic resistance while also reducing the port-to-port flow differences. The lead-in feature 400 could also be done with different dimensions, or as a quarter-round, or quarter-oval, or any non-sharp profile that serves to reduce the sharpness of the entry into the tube-channel for the associated port. While the feature 400 was modeled on only one side of the entry where the benefit was appreciated to be greatest, there is nothing precluding one from applying the feature 400 to both sides if such a duplication was found to also have a benefit. While the feature 400 was modeled in a square opening for the purposes of concept-demonstration and ease-of-modeling, there is nothing precluding one from applying the feature 400 to a round opening. The chamfered feature 400, as modeled, might be fabricated as a milled undercut. This does not preclude the application of other fabrication techniques.

Figure 21:
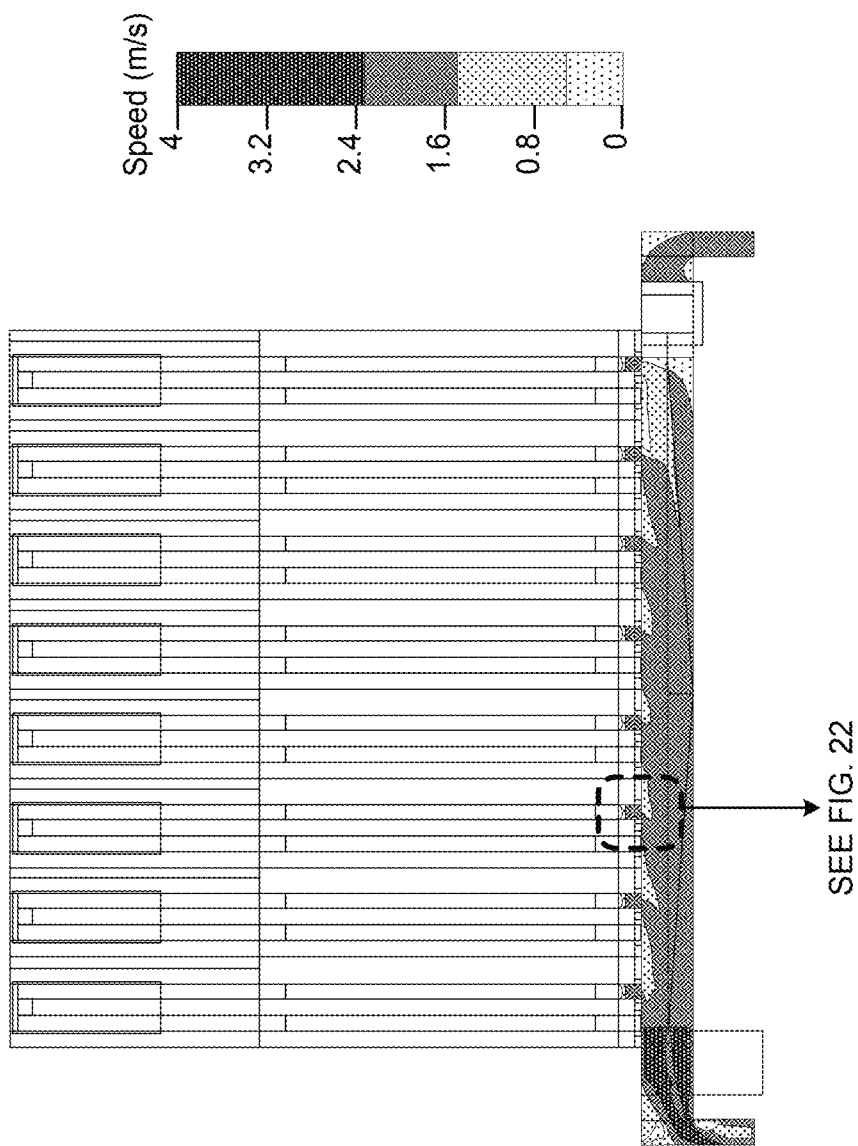
FIG. 21 illustrates the fluid flow associated with a still further embodiment of the coolant distribution manifold assembly of the present disclosure.
Figure 22:
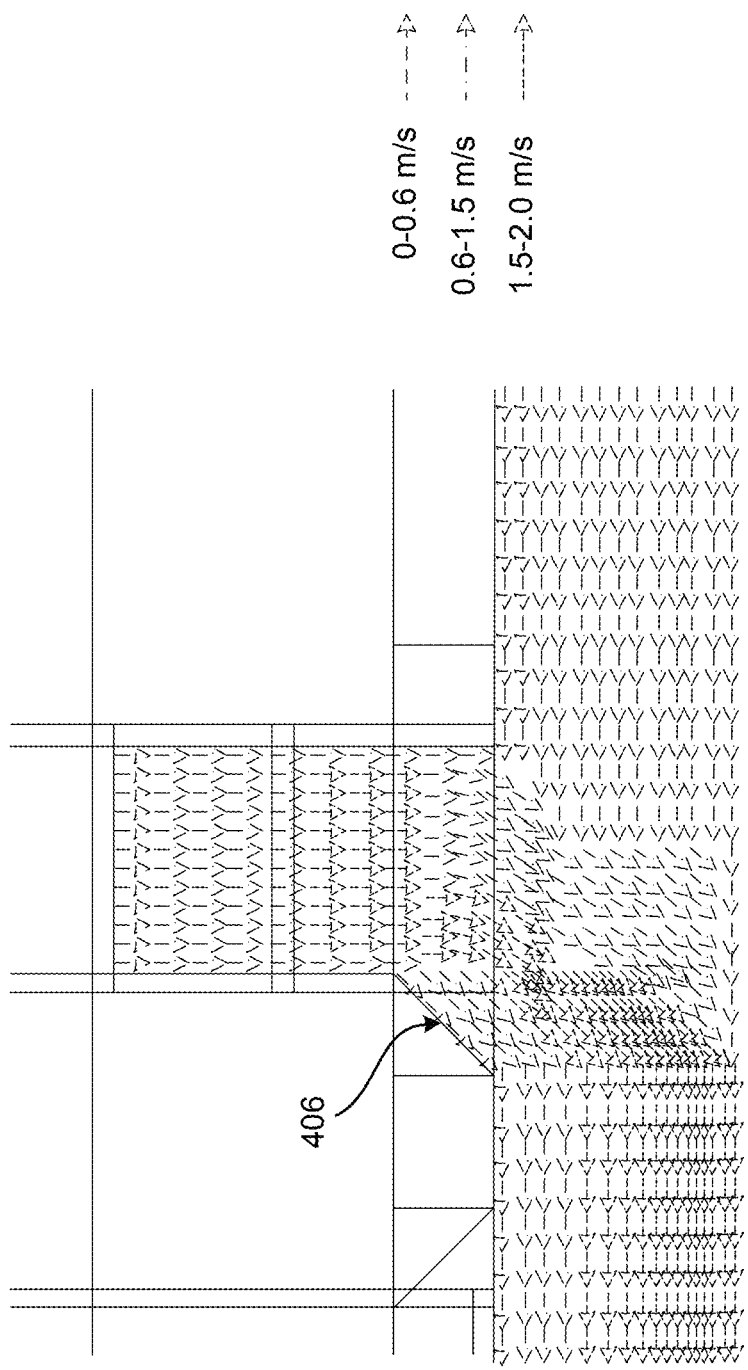
FIG. 22 further illustrates the fluid flow associated with a still further embodiment of the coolant distribution manifold assembly of the present disclosure.

The outlet to each port may be constructed with a lead-out feature 406. FIG. 21 and FIG. 22 show a section through the return ports of the manifold, and flow speed is displayed. Similar to what was noted above, the feature 406 serves to reduce the hydraulic resistance of the flow transition from the port channel to the manifold return channel. Doing so has the overall benefit of reducing total manifold hydraulic resistance while also reducing the port-to-port flow differences. The lead-out feature 406 could also be done with different dimensions. Details of the lead-in feature 400 also apply to the lead-out feature 406.

Figure 19:
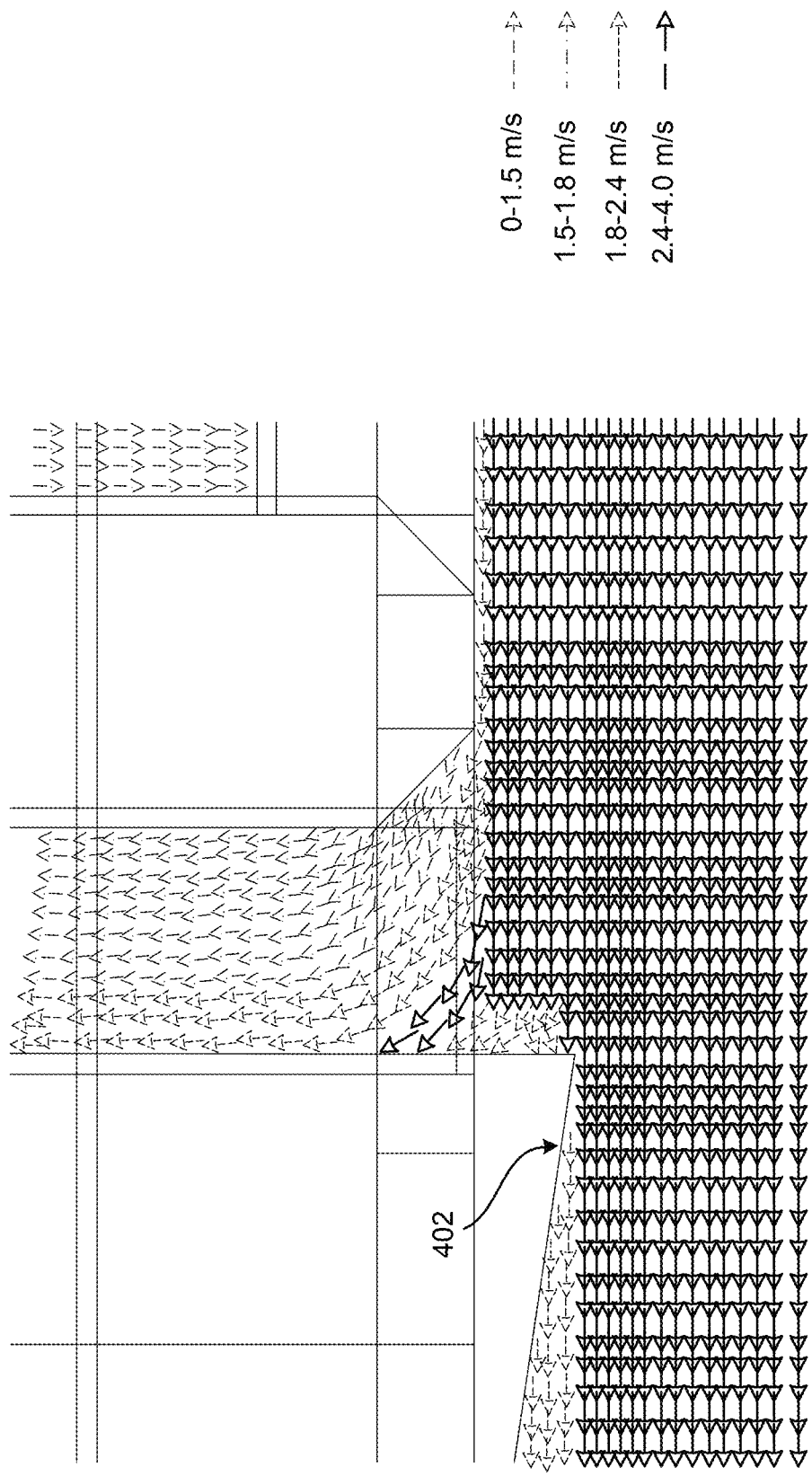
FIG. 19 further illustrates the fluid flow associated with a still further embodiment of the coolant distribution manifold assembly of the present disclosure.

Local (per-port) features may be built into the manifold for the purpose of encouraging or discouraging flow through specific port channels. Two examples are provided. FIG. 17 and FIG. 19 show a section through the supply ports of the manifold, and flow speed is displayed. Without a local feature, which herein we call an "encourager" 402, port 1 experiences a lower flow rate compared to other ports. The encourager 402 serves to increase the flow rate through port 1. In fluid dynamics terms, one way to consider the phenomenon is that the dynamic pressure of the manifold's supply flow is converted locally to static pressure by the encourager 402 and this provides additional potential for flow to circulate through port 1. In lay terms, one may think of the encourager 402 as a "scoop". While this feature 402 slightly increases the overall hydraulic resistance of the manifold, the benefit of improving port flow where it is weakest far outweighs the very minor hydraulic resistance penalty. This feature 402 may be applied independently of whether the channels are rectangular, or tapered in one dimension, or tapered in a complex manner.

Figure 20:
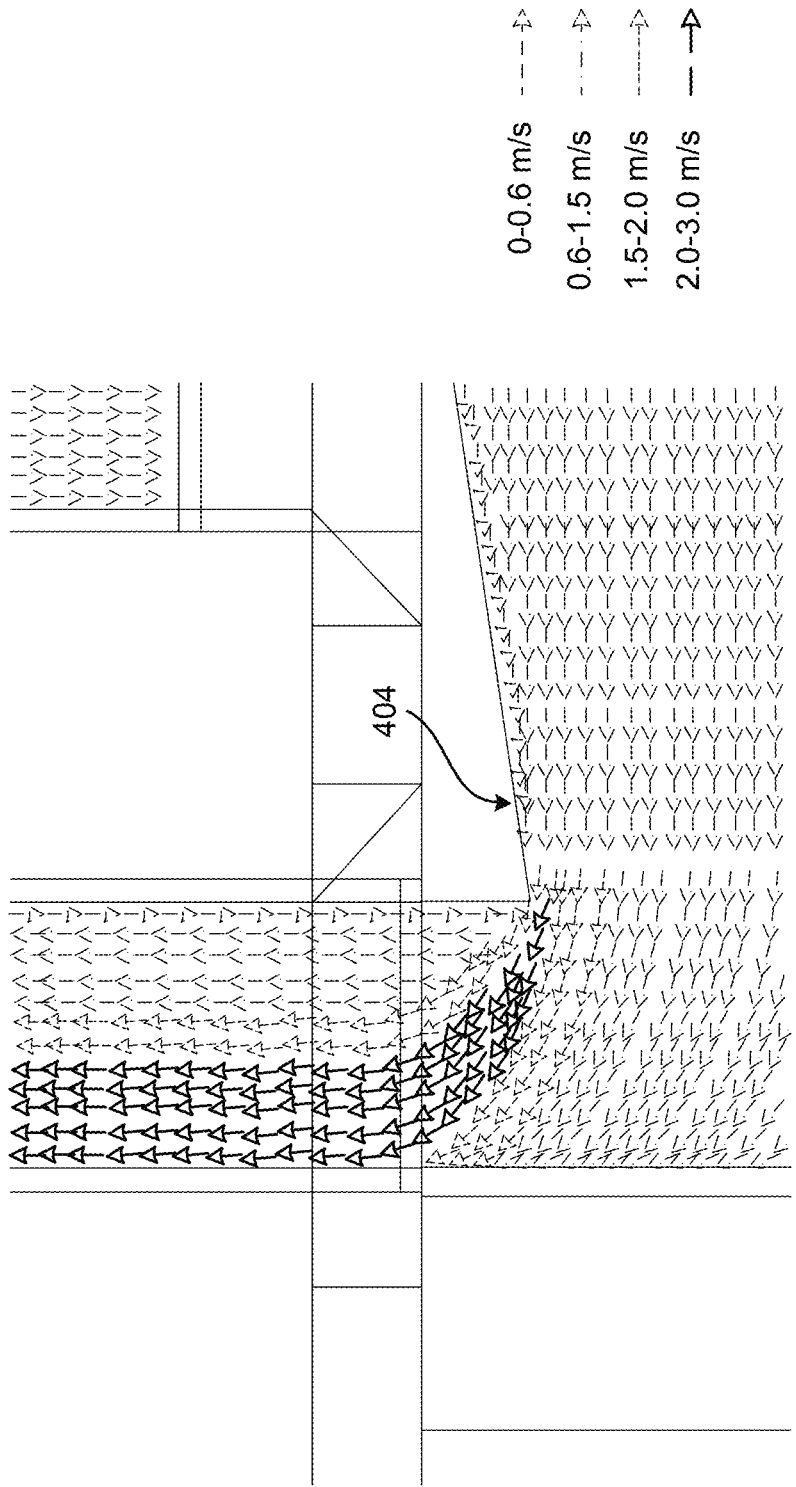
FIG. 20 further illustrates the fluid flow associated with a still further embodiment of the coolant distribution manifold assembly of the present disclosure.

FIG. 17 and FIG. 20 show a section through the supply ports of the manifold, with attention to port 8, and flow speed is displayed. Without a local feature, which herein we call a "discourager" 404, this port 8 experiences a higher flow rate compared to other ports. While this may be good for port 8, it might be detrimental from a system perspective because the system goal may be to cool the ports uniformly. A system goal may be to reduce or eliminate port-to-port differences so that the end user does not have to make port-specific cooling decisions. The discourager 404 serves to decrease the flow rate through port 8 by increasing the hydraulic resistance of the flow transition from the manifold to port 8. The feature 404, in effect, serves the opposite purpose as the lead-in feature 402 associated with FIG. 18. The discourager 404 may be accomplished in various ways: as shown herein, as a bump, as a post, as a mesh, as any type of obstruction adjacent to the port supply or return opening. It may be fabricated by machining the manifold cavity around the feature as required, or additively; e.g., post in hole. This feature 404 may be applied independently of whether the channels are rectangular, or tapered in one dimension, or tapered in a complex manner. A secondary benefit of the discourager 404 is that its presence likely (but not necessarily) results in increased flow through the remaining ports.

In the manner described herein, encouragers 402 and discouragers 404 may be applied to ports in any combination toward achieving port-to-port flow uniformity. Furthermore, the use of encouragers 402 and discouragers 404 in combination with complex tapered flow dividers (between manifold supply and return) serve toward achieving port-to-port flow uniformity while also maintaining low overall hydraulic resistance. In effect, a double goal is achieved. When higher power pluggable optical modules are used; e.g., >50 W, the associated temperature benefit can be significant.

Figure 23:
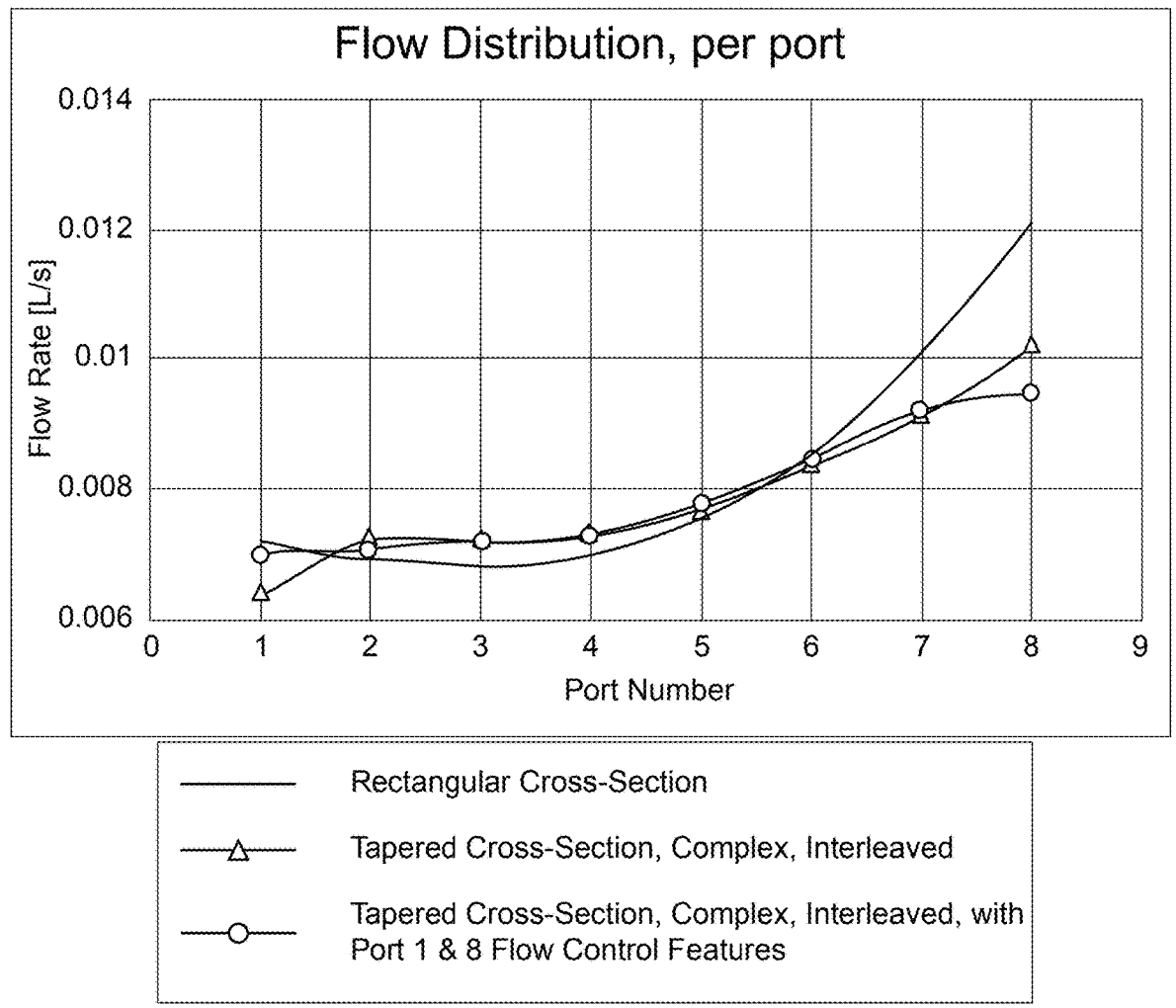
FIG. 23 illustrates the temperature versus port associated with a still further embodiment of the coolant distribution manifold assembly of the present disclosure.

In the simulation of this embodiment (non-optimized implementation), the minimum port flow is 0.0070 L/s (port 1) and the maximum port flow is 0.0095 L/s (port 8). The ratio of max to min is 1.4, which is getting closer to the ideal of unity, and which represents a significant improvement over known methods on similar compact geometry. This is illustrated in FIG. 23.

Figure 24:
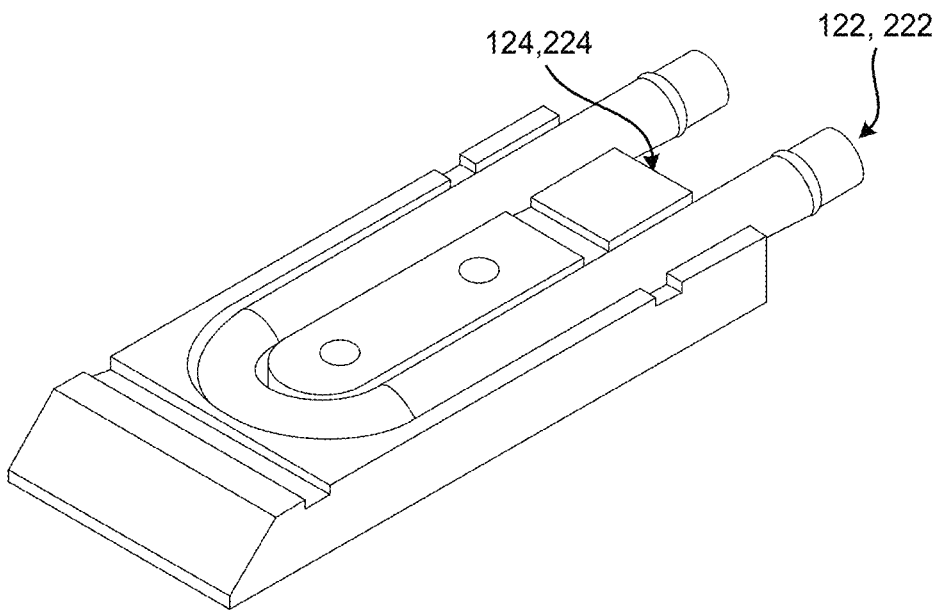
FIG. 24 illustrates a pluggable device cooling plate used in conjunction with the coolant distribution manifold assembly of the present disclosure.
Figure 25:
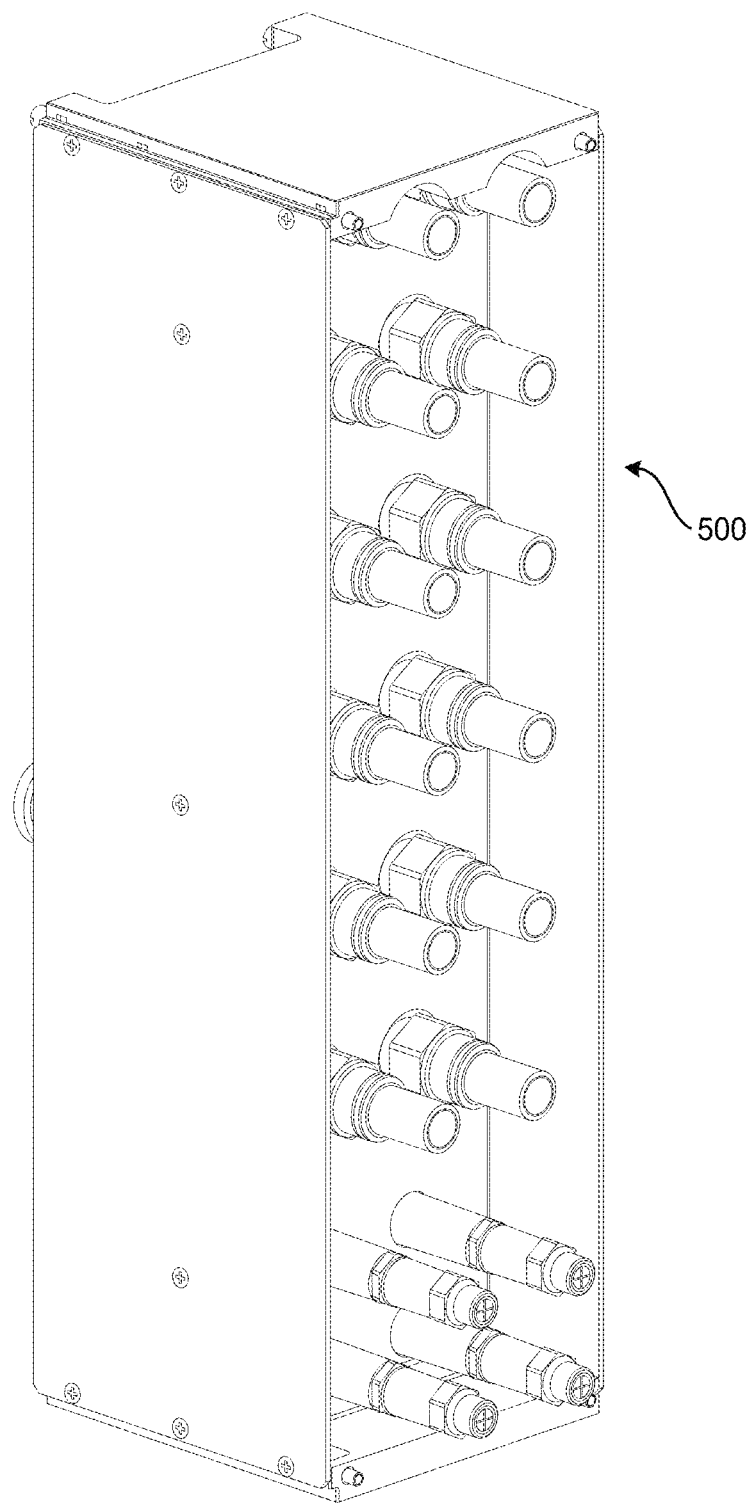
FIG. 25 illustrates a coolant distribution unit used in conjunction with the coolant distribution manifold assembly of the present disclosure.

FIG. 24 illustrates a pluggable device cooling plate 124, 224 used in conjunction with the coolant distribution manifold assembly 110,210,310 of the present disclosure, FIG. 25 illustrates a coolant distribution unit 500 used in conjunction with the coolant distribution manifold assembly 110,210,310 of the present disclosure.

Figure 26:
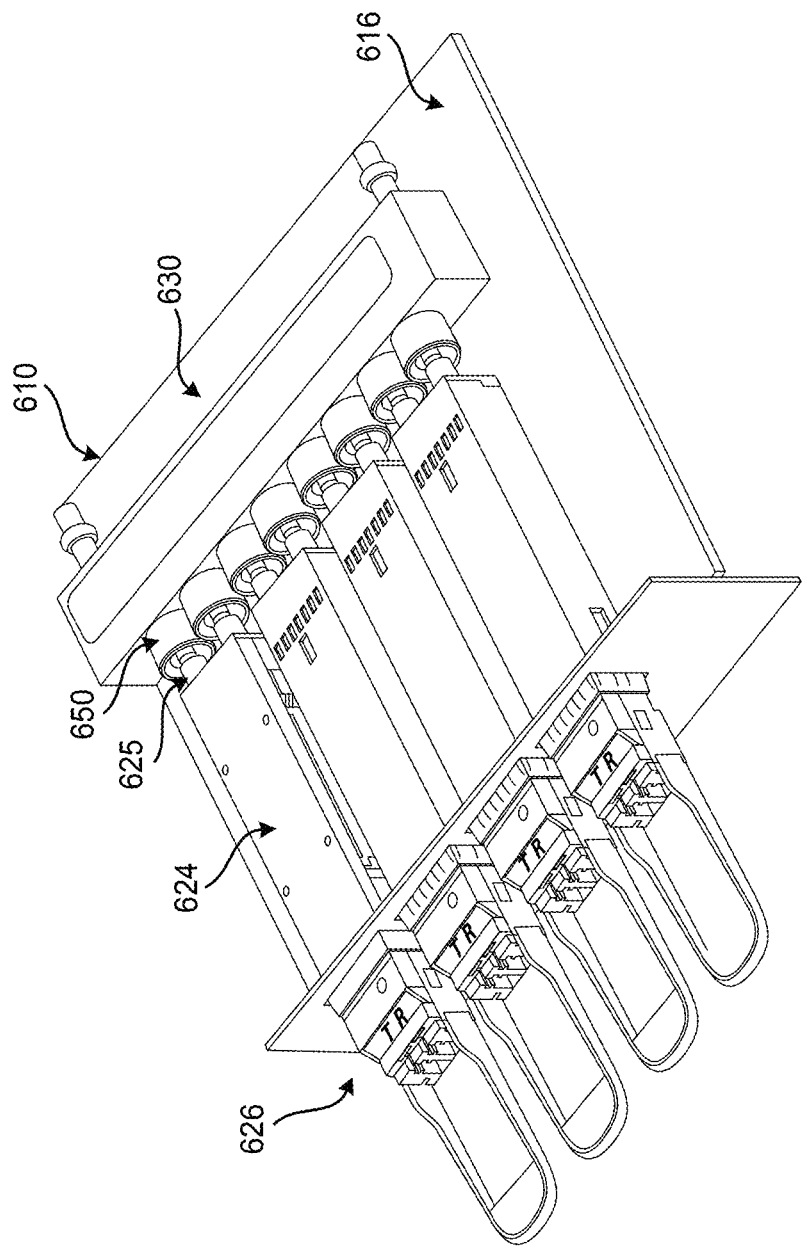
FIG. 26 illustrates a further embodiment of the coolant distribution manifold assembly of the present disclosure, highlighting the use of quick disconnects with pluggable modules with integrated cold plates.

FIG. 26 illustrates a further embodiment of the coolant distribution manifold assembly 610 of the present disclosure, highlighting the use of quick disconnects 650 with pluggable modules 626 with integrated cold plates 624. Here, the pluggable module-side ports in communication with the supply and return plenums include quick disconnects 650 that are disposed at a height from the PCB 616 such that the corresponding supply and return connectors 625 of the pluggable modules 626 are at the same height when the pluggable modules 626 are inserted, such that a blind connection is possible when the pluggable modules 626 are inserted.

Although the present disclosure is Illustrated and described with reference to preferred embodiments and specific examples thereof, it will be readily apparent to those of ordinary skill in the art that other embodiments and examples may perform similar functions and/or achieve like results. All such equivalent embodiments and examples are within the spirit and scope of the present disclosure, are contemplated thereby, and are intended to be covered by the following non-limiting claims for all purposes.

What is claimed is:

1. A coolant distribution manifold assembly for use in a module or circuit pack of an optical networking system, the coolant distribution manifold assembly comprising:
   a body defining a main inlet port at one end of the body, a main outlet port at another end of the body, a plurality of cooling plate inlet ports disposed between the main inlet port and the main outlet port, and a plurality of cooling plate outlet ports disposed between the main inlet port and the main outlet port;
   wherein the body further defines an upper internal plenum coupled to one of the main inlet port and the plurality of cooling plate inlet ports or the main outlet port and the plurality of cooling plate outlet ports;
   wherein the body further defines a lower internal plenum coupled to another of the main inlet port and the plurality of cooling plate inlet ports or the main outlet port and the plurality of cooling plate outlet ports; and
   wherein one or more of:
      the upper internal plenum and the lower internal plenum each have a variable cross-sectional area along a length of the body between the main inlet port and the main outlet port; and/or
      at least a portion of one or more of the upper internal plenum and the lower internal plenum has an L-shaped cross-sectional area along a length of the body such that the upper internal plenum and the lower internal plenum are at least partially interleaved to minimize a height of the body and equalize a flow rate of coolant at each of the cooling plate inlet ports and each of the cooling plate outlet ports.

2. The coolant distribution manifold assembly of claim 1, wherein the body comprises multiple components assembled to form a unitary body.

3. The coolant distribution manifold assembly of claim 1, wherein the body is integrally formed.

4. The coolant distribution manifold assembly of claim 1, wherein the upper internal plenum and the lower internal plenum each have a tapering cross-sectional area along a length of the body between the main inlet port and the main outlet port.

5. The coolant distribution manifold assembly of claim 1, wherein the variable cross-sectional area of each of the upper internal plenum and the lower internal plenum along the length of the body between the main inlet port and the main outlet port equalizes a flow rate of coolant at each of the cooling plate inlet ports and each of the cooling plate outlet ports.

6. The coolant distribution manifold assembly of claim 1, wherein the body further defines or contains one or more flow modification structures associated with one or more of the plurality of cooling plate inlet ports or cooling plate outlet ports.

7. The coolant distribution manifold assembly of claim 1, wherein the plurality of cooling plate inlet ports and the plurality of cooling plate outlet ports are offset along a length of the body between the main inlet port and the main outlet port such that a height of the body is minimized.

8. A liquid cooling assembly for an optical networking system, the liquid cooling assembly comprising:
   a coolant distribution unit;
   a plurality of input coolant lines coupled to a plurality of cooling plates;
   a plurality of output coolant lines coupled to the plurality of cooling plates; and
   a coolant distribution manifold assembly, comprising:
      a body defining a main inlet port coupled to the coolant distribution unit at one end of the body, a main outlet port coupled to the coolant distribution unit at another end of the body, a plurality of cooling plate inlet ports disposed between the main inlet port and the main outlet port and coupled to the plurality of input coolant lines, and a plurality of cooling plate outlet ports disposed between the main inlet port and the main outlet port and port and coupled to the plurality of output coolant lines;
      wherein the body further defines an upper internal plenum coupled to one of the main inlet port and the plurality of cooling plate inlet ports or the main outlet port and the plurality of cooling plate outlet ports;
      wherein the body further defines a lower internal plenum coupled to another of the main inlet port and the plurality of cooling plate inlet ports or the main outlet port and the plurality of cooling plate outlet ports; and
   wherein one or more of:
      the upper internal plenum and the lower internal plenum each have a variable cross-sectional area along a length of the body between the main inlet port and the main outlet port; and/or
      at least a portion of one or more of the upper internal plenum and the lower internal plenum has an L-shaped cross-sectional area along a length of the body such that the upper internal plenum and the lower internal plenum are at least partially interleaved to minimize a height of the body and equalize a flow rate of coolant at each of the cooling plate inlet ports and each of the cooling plate outlet ports.

9. The liquid cooling assembly of claim 8, wherein the body is integrally formed.

10. The liquid cooling assembly of claim 8, wherein the plurality of cooling plate inlet ports and the plurality of cooling plate outlet ports are offset along a length of the body between the main inlet port and the main outlet port such that a height of the body is minimized.

11. A method for providing a coolant distribution manifold assembly for use in a module or circuit pack of an optical networking system, the method comprising:
   forming a body defining a main inlet port at one end of the body, a main outlet port at another end of the body, a plurality of cooling plate inlet ports disposed between the main inlet port and the main outlet port, and a plurality of cooling plate outlet ports disposed between the main inlet port and the main outlet port;
   wherein the body further defines an upper internal plenum coupled to one of the main inlet port and the plurality of cooling plate inlet ports or the main outlet port and the plurality of cooling plate outlet ports; and
   wherein the body further defines a lower internal plenum coupled to another of the main inlet port and the plurality of cooling plate inlet ports or the main outlet port and the plurality of cooling plate outlet ports; and one of:
      milling the upper internal plenum into a top surface of the body, milling the lower internal plenum into a bottom surface of the body, affixing a cover to the top surface of the body, and affixing a cover to the bottom surface of the body; or
      milling the upper internal plenum and the lower internal plenum into a side surface of the body and affixing one or more covers to the side surface of the body.

12. The method of claim 11, wherein forming the body comprises assembling multiple components to form a unitary body.

13. The method of claim 11, wherein forming the body comprises integrally forming the body.

14. The method of claim 11, wherein the upper internal plenum and the lower internal plenum each have a variable cross-sectional area along a length of the body between the main inlet port and the main outlet port.

15. The method of claim 14, wherein the upper internal plenum and the lower internal plenum each have a tapering cross-sectional area along a length of the body between the main inlet port and the main outlet port.

16. The method of claim 11, wherein the body further defines or contains one or more flow modification structures associated with one or more of the plurality of cooling plate inlet ports or cooling plate outlet ports.

\* \* \* \* \*